(12) United States Patent  
Hazelton

(10) Patent No.: US 6,271,606 B1
(45) Date of Patent: *Aug. 7, 2001

(54) DRIVING MOTORS ATTACHED TO A STAGE THAT ARE MAGNETICALLY COUPLED THROUGH A CHAMBER

(75) Inventor: Andrew J. Hazelton, San Carlos, CA (US)

(73) Assignee: Nikon Corporation (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/470,716

(22) Filed: Dec. 23, 1999

(51) Int. Cl.[7] .................. H02K 41/00; H02K 41/02; H01L 21/00
(52) U.S. Cl. .............. 310/12; 310/13; 310/156; 310/90.5; 310/89; 250/491.1; 414/935
(58) Field of Search ............... 310/12, 13, 156, 310/90.5, 89; 250/491.1; 356/401; 414/935, 936, 940, 749.1

(56) References Cited

U.S. PATENT DOCUMENTS

| | | | |
|---|---|---|---|
| 4,518,078 | * | 5/1985 | Garrett .................. 414/935 |
| 4,540,326 | * | 9/1985 | Southworth et al. ........ 414/217 |
| 4,604,020 | * | 8/1986 | Toro Lira et al. ........... 414/935 |
| 4,624,617 | * | 11/1986 | Belna ..................... 414/347 |
| 4,664,578 | * | 5/1987 | Kakehi .................. 414/217 |
| 5,196,745 | * | 3/1993 | Trumper ................. 310/12 |
| 5,260,580 | * | 11/1993 | Itoh et al. ............... 250/492.2 |
| 5,309,049 | * | 5/1994 | Kawada et al. ............ 310/12 |
| 5,528,118 | * | 6/1996 | Lee ..................... 318/568.17 |
| 5,623,853 | * | 4/1997 | Novak et al. ............. 74/490.09 |
| 5,641,054 | * | 6/1997 | Mori et al. .............. 198/619 |
| 5,668,672 | * | 9/1997 | Oomura ................. 359/727 |
| 5,689,377 | * | 11/1997 | Takahashi ............... 359/727 |
| 5,701,041 | * | 12/1997 | Akutsu et al. ............ 310/12 |
| 5,808,379 | * | 9/1998 | Zhao .................... 310/12 |
| 5,835,275 | * | 11/1998 | Takahashi et al. .......... 359/629 |
| 5,870,943 | * | 7/1998 | Ono ..................... 310/12 |
| 5,874,820 | * | 2/1999 | Lee ..................... 318/575 |
| 5,925,956 | * | 7/1999 | Ohzeki ................. 310/12 |
| 5,942,357 | * | 8/1999 | Ota ..................... 430/22 |
| 6,002,465 | * | 12/1999 | Korenaga ................ 355/53 |
| 6,028,376 | * | 2/2000 | Osanai et al. ............. 310/12 |
| 6,043,572 | * | 3/2000 | Nagai et al. ............. 310/12 |
| 6,107,703 | * | 8/2000 | Korenaga ................ 310/12 |

OTHER PUBLICATIONS

Nigel S. Harris, *Modern Vacuum Practice*, Publication Page and p. 107, Copyright 1989 and Reprinted in 1997, McGraw–Hill Publishing Company, Great Britain at the University Press, Cambridge.

* cited by examiner

*Primary Examiner*—Burton S. Mullins
(74) *Attorney, Agent, or Firm*—Steven G. Roeder; James P. Broder; Jim Rose

(57) ABSTRACT

A motor combination (10) for enclosing and moving a stage (28) (30) for an exposure apparatus (32) is provided herein. The motor combination (10) includes a motor (12) and a chamber (14). The motor (12) has a first component (16) and a second component (18). One of the components (16) (18) includes a magnet array (36) having at least one magnet (42) and the other component (16) (18) includes a conductor array (38) having at least one conductor (44). The chamber (14) encircles and encloses one of the stages (28) (30) and the second component (18) of the motor (12). Importantly, the chamber (14) includes a wall (20) that is interposed between the first component (16) and the second component (18) and the motor (12) is magnetically coupled through the wall (20) of the chamber (14). With this design, the object (22) is enclosed by the chamber (14) and any reaction forces of the motor (12) can be easily transferred to a ground (24) or a reaction mass (26).

44 Claims, 18 Drawing Sheets

FIG. 8a
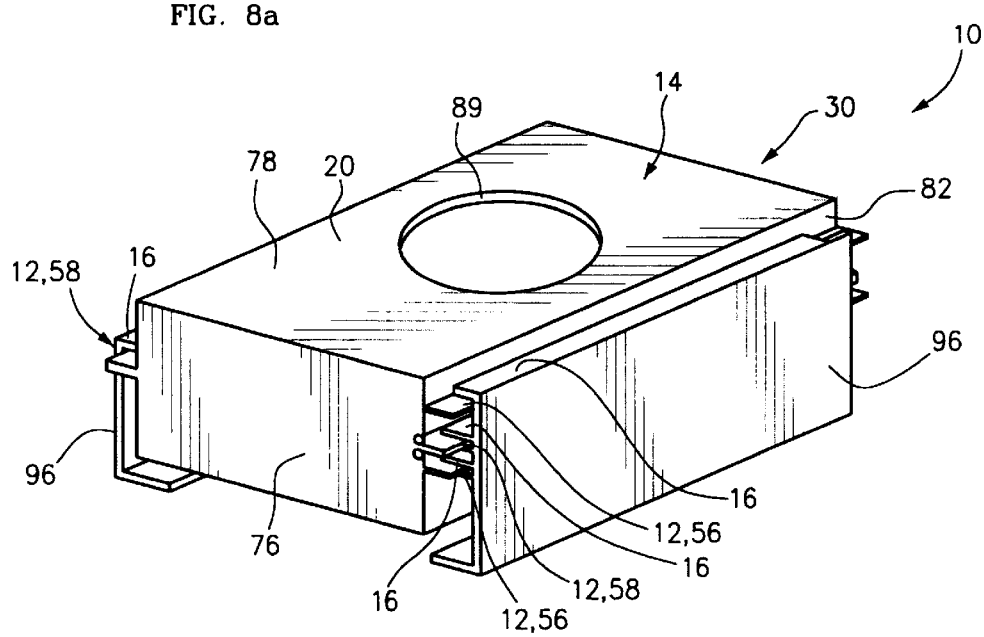
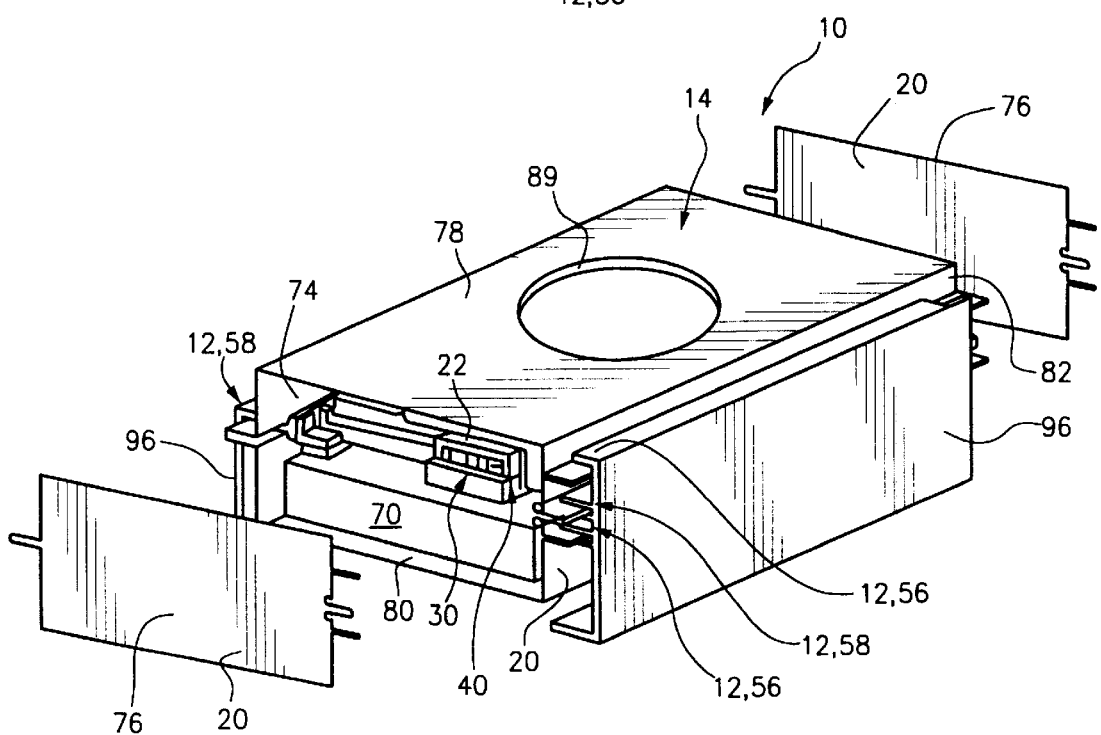
FIG. 8b

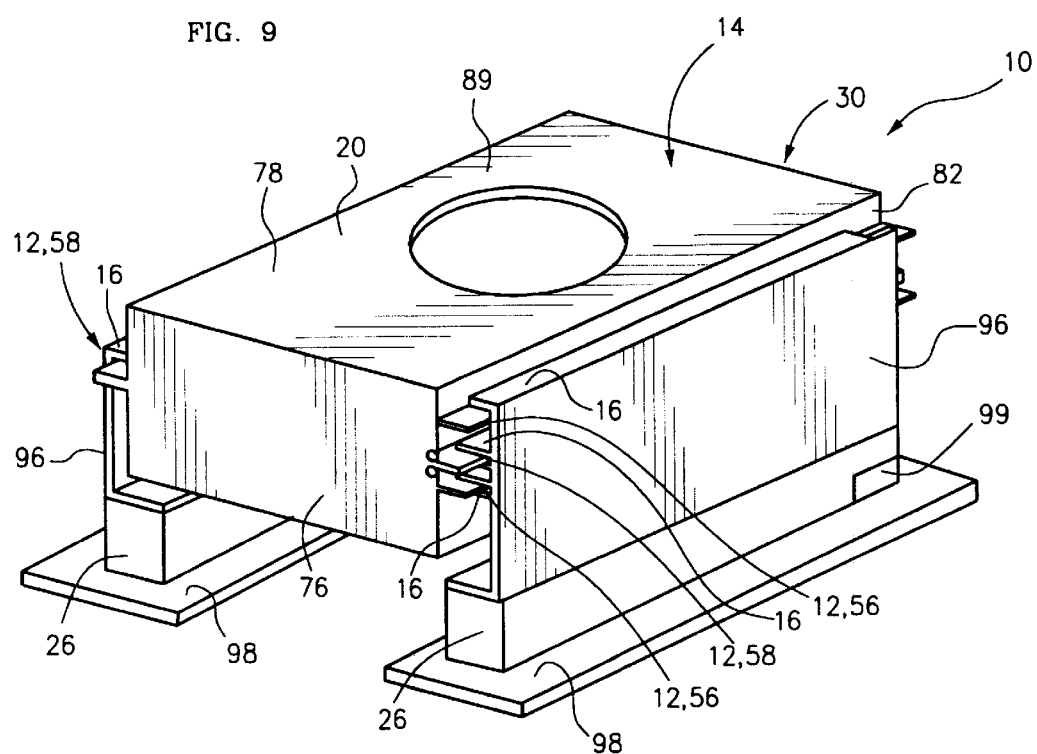

DRIVING MOTORS ATTACHED TO A STAGE THAT ARE MAGNETICALLY COUPLED THROUGH A CHAMBER

FIELD OF THE INVENTION

The present invention is directed to motors that are magnetically coupled through a chamber. More specifically, the present invention is directed to a motor combination that encloses and positions a stage for an exposure apparatus.

BACKGROUND

Linear motors are used in a variety of electrical devices. For example, linear motors are used in exposure apparatuses for semiconductor processing, other semiconductor processing equipment, elevators, electric razors, machine tools, machines, inspection machines, and disk drives.

Exposure apparatuses are commonly used to transfer images from a reticle onto a semiconductor wafer during semiconductor processing. A typical exposure apparatus includes an illumination source, a reticle stage retaining a reticle, a lens assembly and a wafer stage retaining a semiconductor wafer. The reticle stage and the wafer stage are supported above a ground with an apparatus frame. Typically, one or more linear motors precisely position the wafer stage and one or more linear motors precisely position the reticle stage. The images transferred onto the wafer from the reticle are extremely small. Accordingly, the precise relative positioning of the wafer and the reticle is critical to the manufacturing of high density semiconductor wafers.

A typical, linear motor includes a magnet assembly that generates a magnetic field and a coil assembly that is positioned near the magnet assembly. The coil assembly includes one or more coils which are individually supplied with an electrical current. Electrical current in the coils interacts with the magnetic field of the magnet assembly. This causes one of the assemblies to move relative to the other assembly. The assembly that moves can be secured to one of the stages, while the other assembly is secured to the apparatus frame. With this design, the stage moves in concert with one of the assemblies relative to the apparatus frame.

Unfortunately, reaction forces transferred to the apparatus frame from each linear motor can deflect the apparatus frame and influence the positions of the stages. This reduces the accuracy of the exposure apparatus and degrades the quality of the semiconductor wafer. Thus, it is often desirable to transfer the reaction forces directly to the ground with a separate reaction frame or to a reaction mass.

Additionally, depending upon the illumination source, the performance of exposure apparatus can be enhanced by controlling the environment around one or both stages. One way to control the environment around a stage is to position a chamber around the stage. Subsequently, the desired environment can be created within the chamber around the stage. However, with the chamber, it is difficult to transfer the reaction forces from the linear motor to the ground or to a reaction mass.

In light of the above, it is an object of the present invention to provide a motor combination that encloses and positions a stage for an exposure apparatus. Another object of the present invention is to couple a linear motor through a chamber so that the reaction forces from the motor can be transferred outside the chamber. Yet another object of the present invention is to couple a motor through a chamber without compromising the seal of the chamber. Still another object of the present invention is to provide an exposure apparatus capable of manufacturing high density semiconductor wafers.

SUMMARY

The present invention is directed to a motor combination for encircling and positioning an object that satisfies these needs. The motor combination includes a motor that is used for moving and positioning the object and a chamber that encloses the object. The motor includes a first component and a second component. The chamber includes a wall that is interposed between the first component and the second component of the motor.

With the design provided herein, the motor is magnetically coupled through the wall. Further, the object is enclosed by the chamber and the reaction forces of the motor can be easily transferred to the ground or a reaction mass. As a result thereof, the size of the chamber can be reduced because one of the components of the motor is outside the chamber and bulky seals are not needed to seal around the first motor.

As used herein, the term "non-commutated voice coil motor" shall mean a short stroke electromagnetic actuator in which the current is a function of the required force only and not the relative position between the coil and the magnet.

As used herein, the term "commutated linear motor" shall mean an electromagnetic actuator in which the current is varied as a function of the relative position between the coil and the magnet.

A number of alternate embodiments of the motor are provided herein. In each embodiment, one of the components includes at least one magnet and the other component including at least one conductor. Further, the second component moves on a path back and forth relative to the first component. As provided herein, the second component typically moves relative to the first component. Depending upon the direction of movement and the amount of movement, the motor can be either a non-commutated voice coil motor or a commutated motor.

The chamber is positioned between the first component and the second component of the motor and is sized and shaped to enclose the object and the second component of the motor. With this design, the chamber provides a physical barrier between the environment around the first component and the environment around the second component. This allows the second component and the object to be positioned in a controlled environment.

The present invention is also directed to a method for enclosing and positioning an object. The method includes the steps of encircling the object with a chamber and magnetically coupling a motor through the chamber. The present invention is also directed to a method for moving an object, a method for manufacturing a motor combination, a method for manufacturing an exposure apparatus and a method for manufacturing a device (for example, semiconductor device).

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 8A is a perspective view of a stage and a motor combination having features of the present invention;

FIG. 8B is a partly exploded perspective view of the stage and motor combination of FIG. 8A;

FIG. 9 is a perspective view of another embodiment of a motor combination and a stage having features of the present invention;

DESCRIPTION

Figure 1:
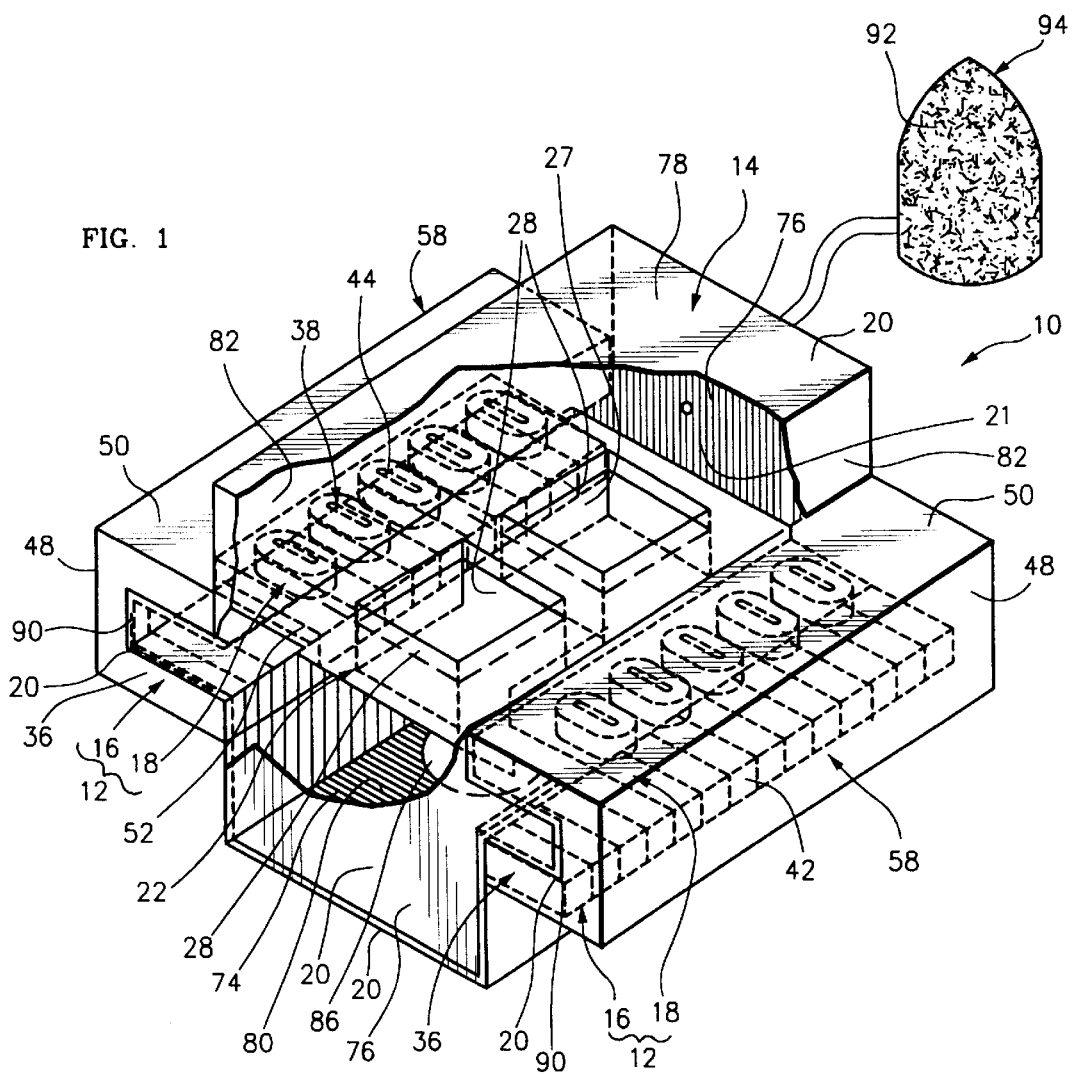
FIG. 1 is a perspective view of a motor combination and a reticle stage having features of the present invention.

Referring initially to FIG. 1, a motor combination 10 having features of the present invention includes one or more, spaced apart, motors 12 and a chamber 14. Each motor 12 includes a first component 16 and a second component 18 that interacts with the first component 16. The chamber 14 includes one or more walls 20 that are interposed between the first component 16 and the second component 18 of each motor 12. As a result thereof, the motors 12 are magnetically coupled through the chamber 14. Because the motors 12 are magnetically coupled through the chamber 14, the reaction forces of each motor 12 can be easily transferred to the ground 24 (illustrated in FIG. 10) or a reaction mass 26 (illustrated in FIG. 9), without compromising the seal quality of the chamber 14.

With this design, the motor combination 10 is able to provide a controlled environment 21 around an object 22 and precisely position the object 22 within the controlled environment 21. As a result of the present invention, the size of the chamber 14 can be reduced because the first components 16 of each motor 12 of the motor combination 10 are positioned outside the chamber 14. Further, one or more bulky seals (not shown) are not needed to seal around the motors 12.

The type of object 22 positioned within the chamber 14 and moved by the one or more motors 12 can be varied. For example, the object 22 can be a reticle 27 and a reticle stage 28 (illustrated in FIGS. 1, 7, and 10) or the object 22 can be a semiconductor wafer 29 and a wafer stage 30 (illustrated in FIGS. 8A—8D, 9 and 10) of an exposure apparatus 32 (illustrated in FIG. 10).

Referring specifically to FIG. 1, the chamber 14 encloses and encircles the reticle stage 28 and provides the controlled environment 21 around the reticle 27 and the reticle stage 28. The reticle stage 28 is designed to retain and position one or more reticles 27 (only one is illustrated) during processing. The design of the reticle stage 28 can be varied to suit the design requirements of the exposure apparatus 32. The reticle stage 28 illustrated in FIG. 1 is generally rectangular shaped, and includes two separate reticle holders designed to retain two separate reticles 27. This reticle stage 28 is moved and positioned by two spaced apart linear motors 12 which are magnetically coupled through the chamber 14. In this design, the second component 18 of each motor 12 is integral with the reticle stage 28 and is enclosed by the chamber 14. However, the number of motors 12 magnetically coupled through the chamber 14 and the design of each motor 12 can be varied as provided below.

Figure 8C:
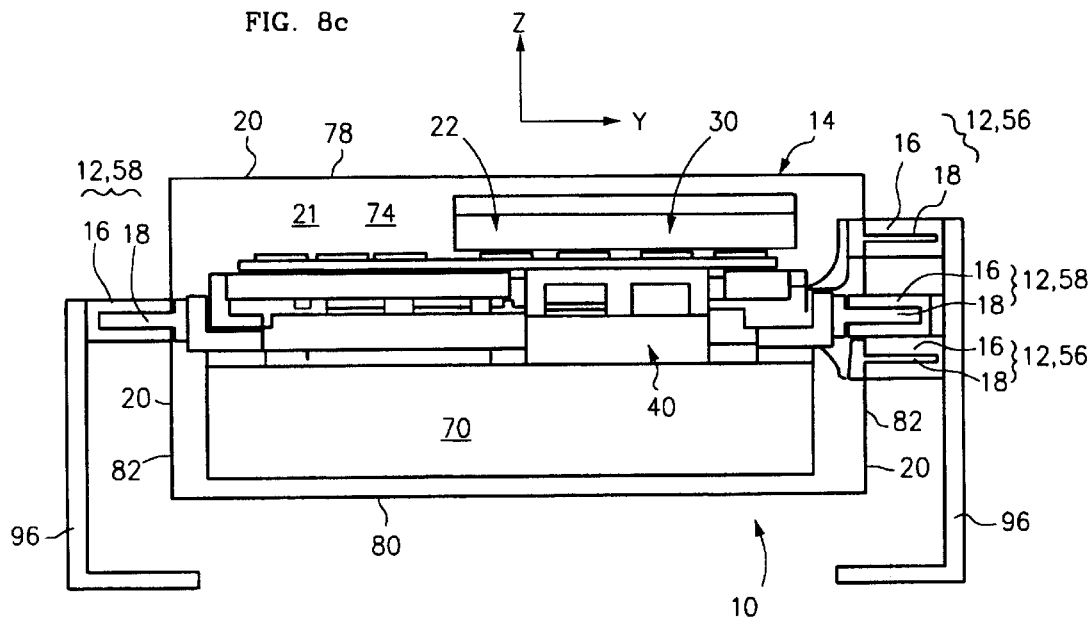
FIG. 8C is a front plan view of the stage and motor combination of FIG. 8A with a portion of the chamber removed for clarity.
Figure 8D:
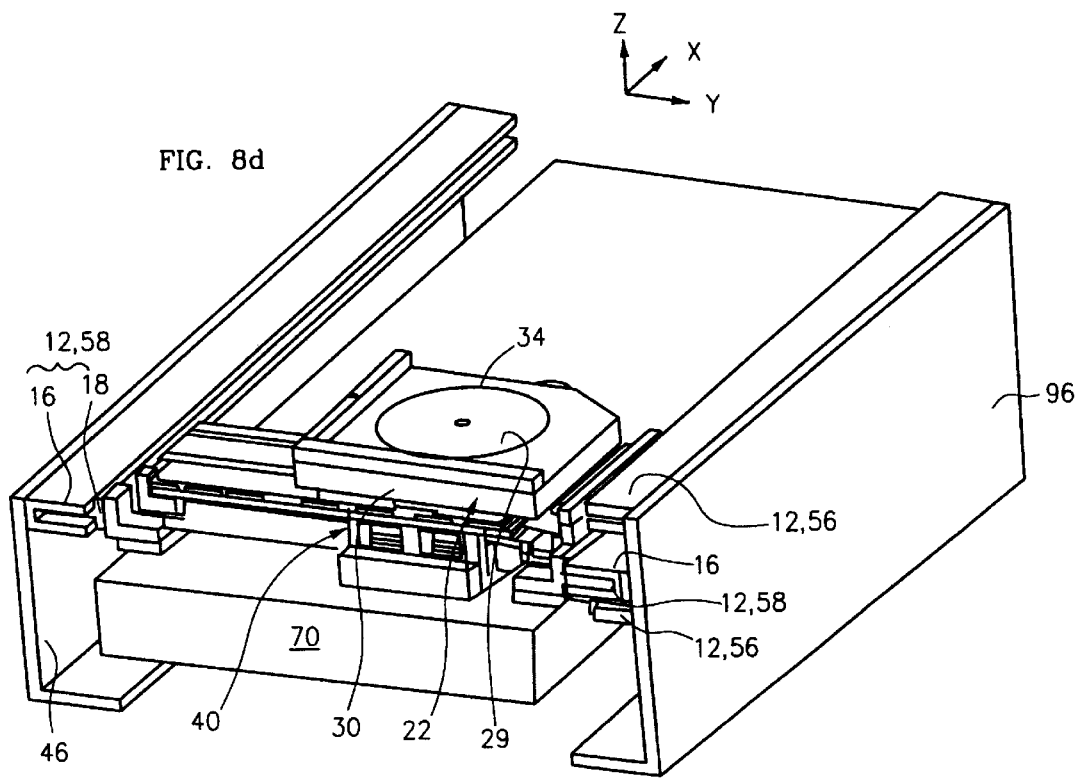
FIG. 8D is a perspective view of the stage and motor of FIG. 8A without the chamber.

Referring to FIGS. 8A–8D, the chamber 14 encloses and encircles the wafer stage 30 and provides the controlled environment 21 around the wafer stage 30 and the wafer 29. The wafer stage 30 is designed to retain and position a semiconductor wafer 29 during processing. The design of the wafer stage 30 can be varied to suit the design requirements of the exposure apparatus 32. The wafer stage 30 illustrated in FIG. 8D is generally rectangular shaped and includes a holder 34, e.g., a vacuum chuck, for retaining the wafer 29. The wafer stage 30 illustrated in FIG. 8A–8D is moved and positioned by two, spaced apart linear motors 12 that are magnetically coupled through the chamber 14. In this design, the second component 18 of each motor 12 is integral with the wafer stage 30 and is enclosed by the chamber 14.

As illustrated in FIGS. 2A–6D, a number of alternate embodiments of the motor 12 are provided herein. In each embodiment, one of the components 16, 18 of each motor 12 includes one or more magnet arrays 36 and the other component 16, 18 of each motor 12 includes one or more conductor arrays 38. Additionally, in each embodiment illustrated herein, the second component 18 moves back and forth along a non-circular, path 39 (illustrated in FIGS. 2A, 2C, 3A, 3C, 4A, 4C, 5A, 5C) relative to the first component 16 and the chamber 14. More specifically, in each embodiment illustrated herein, the second component 18 moves substantially linearly along the path 39 relative to the first component 16 and the chamber 14.

Further, in each embodiment, the chamber 14 encircles and encloses the second component 18 while the first component 16 is positioned outside the chamber 14. With this design, the first component 16 of each motor 12 of the motor combination 10 can be easily coupled to the ground 24 (illustrated in FIG. 10) or the reaction mass 26 outside the chamber 14 (illustrated in FIG. 9) to transfer the reaction forces of the motors 12. Alternately, a reaction mass 68 can be positioned inside the chamber 14 and secured to the second component 18 (illustrated in FIG. 7). As provided below, the stages 28, 30 can also include additional motors 40 (illustrated in FIGS. 7 and 8B–8D) which are not magnetically coupled through the chamber 14.

Each magnet array 36 includes one or more magnets 42. The design of each magnet array 36 and the number of magnets 42 in each magnet array 36 can be varied to suit the design requirements of the motor 12. In the embodiments provided herein, each magnet 42 is substantially rectangular shaped. However, the shape of each magnet 42 can be varied.

Each conductor array 38 includes one or more conductors 44. The design of each conductor array 38 and the number of conductors 44 in each conductor array 38 can be varied to suit the design requirements of the motor 12. The conductor 44 can be made of metal such as copper or any substance or material responsive to electrical current and capable of creating a magnetic field such as superconductors. In the embodiments illustrated herein, each conductor 44 is a substantially annular shaped coil. Each coil typically includes a plurality of electrical wires 46 (illustrated in FIGS. 2B, 2D, 3B, 3D, 4B, 4D, 5B, 5D and 6A–6D) encapsulated in an epoxy.

Electrical current (not shown) is individually supplied to each conductor 44 in each conductor array 38. The electrical current in each conductor 44 interacts with a magnetic field (not shown) generated by the one or more of the magnets 42 in the magnet array 36. This causes a force (Lorentz Force) between the conductors 44 and the magnets 42 which can be used to move the second component 18 relative to the first component 16 of each motor 12.

Figure 2A:
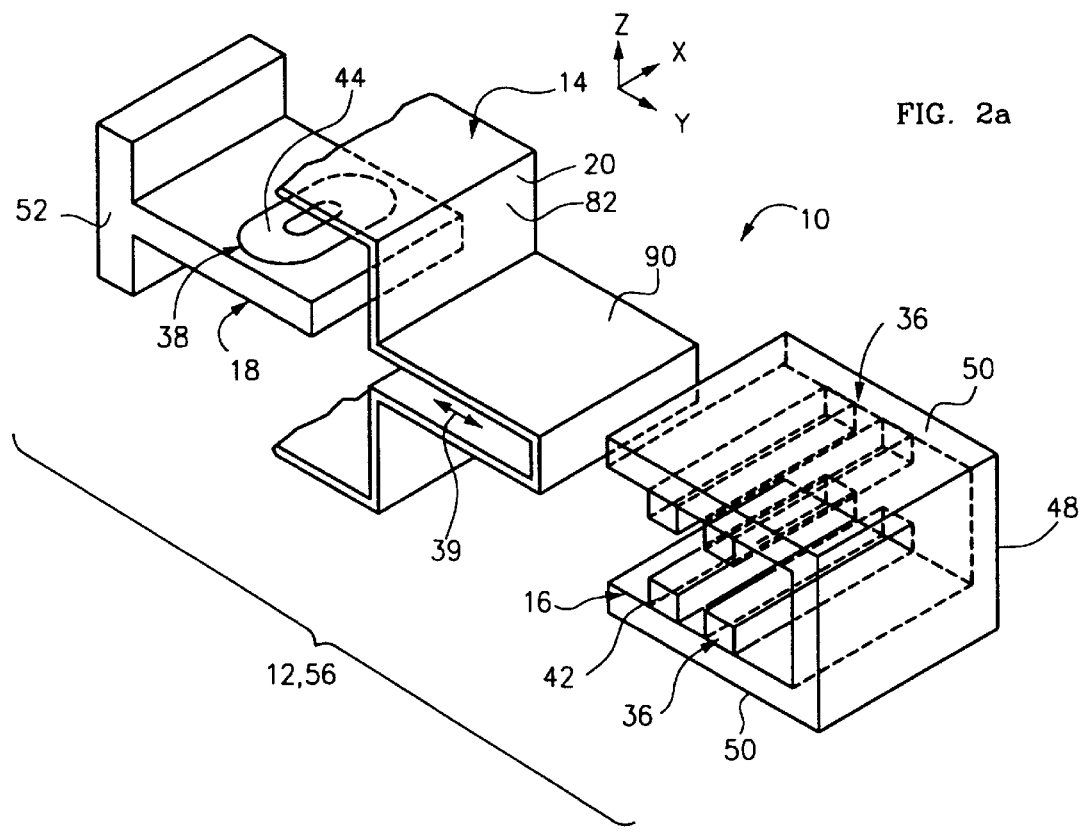
FIG. 2A is an exploded perspective view of a first embodiment of a motor and a portion of a chamber having features of the present invention.
Figure 2B:
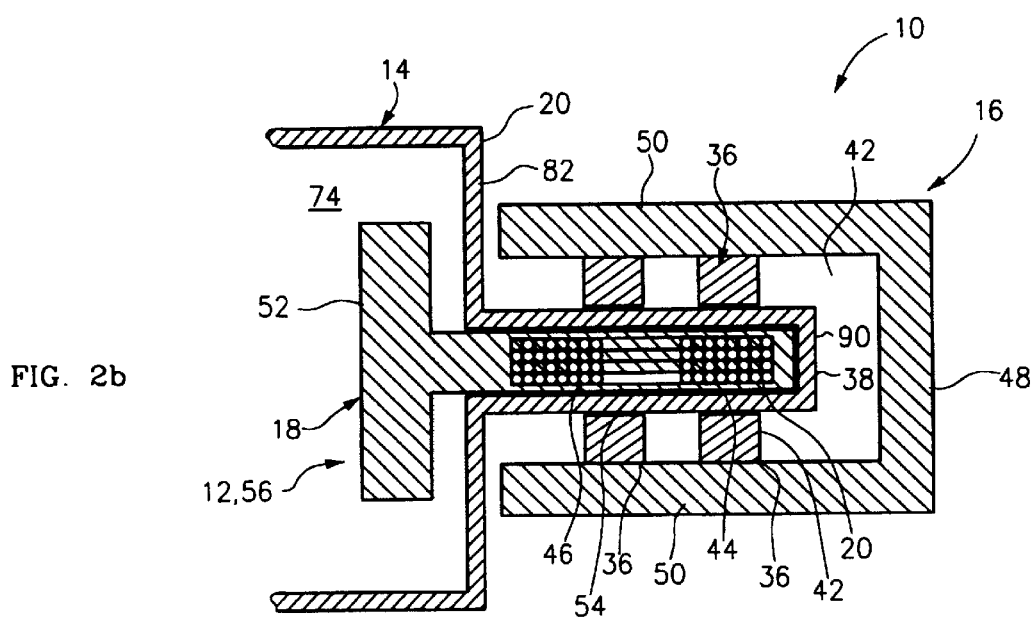
FIG. 2B is a cut-away view of the motor and a portion of the chamber of FIG. 2A.

FIG. 2A illustrates an exploded perspective view and FIG. 2B illustrates a cross-sectional view of a first embodiment of a motor 12 and a portion of the chamber 14 having features of the present invention. In the first embodiment, the first component 16 includes a pair of spaced apart, magnet arrays 36 while the second component 18 includes a conductor array 38 positioned between the magnet arrays 36. More specifically, the first component 16 includes a first component body 48 having a generally "U" shaped cross-section and a pair of spaced apart legs 50. One of the magnet arrays 36 is secured to each of the legs 50. The second component 18 includes a second component body 52 having a generally "T" shaped cross-section and the conductor array 38 positioned in the second component body 52.

A gap 54 exists between the first component 16 and the second component 18. Preferably, the gap 54 is between approximately one millimeter and five millimeter. However, depending upon the design of the motor combination 10, a larger or smaller gap 54 may be utilized. The wall 20 of the chamber 14 is positioned in the gap 54. With this design, the second component 18 is secured to the object 22 (not shown in FIGS. 2A, 2B) within the chamber 14 and the first component 16 is positioned outside the chamber 14.

In the embodiment illustrated in FIGS. 2A, 2B the motor 12 is a non-commutated voice coil motor 56. In this embodiment, the second component 18 moves linearly along the Y axis relative to the first component 16. Also, in this embodiment, the conductor array 38 includes a single conductor 44 while each magnet array 36 includes a pair of magnets 42.

Figure 2C:
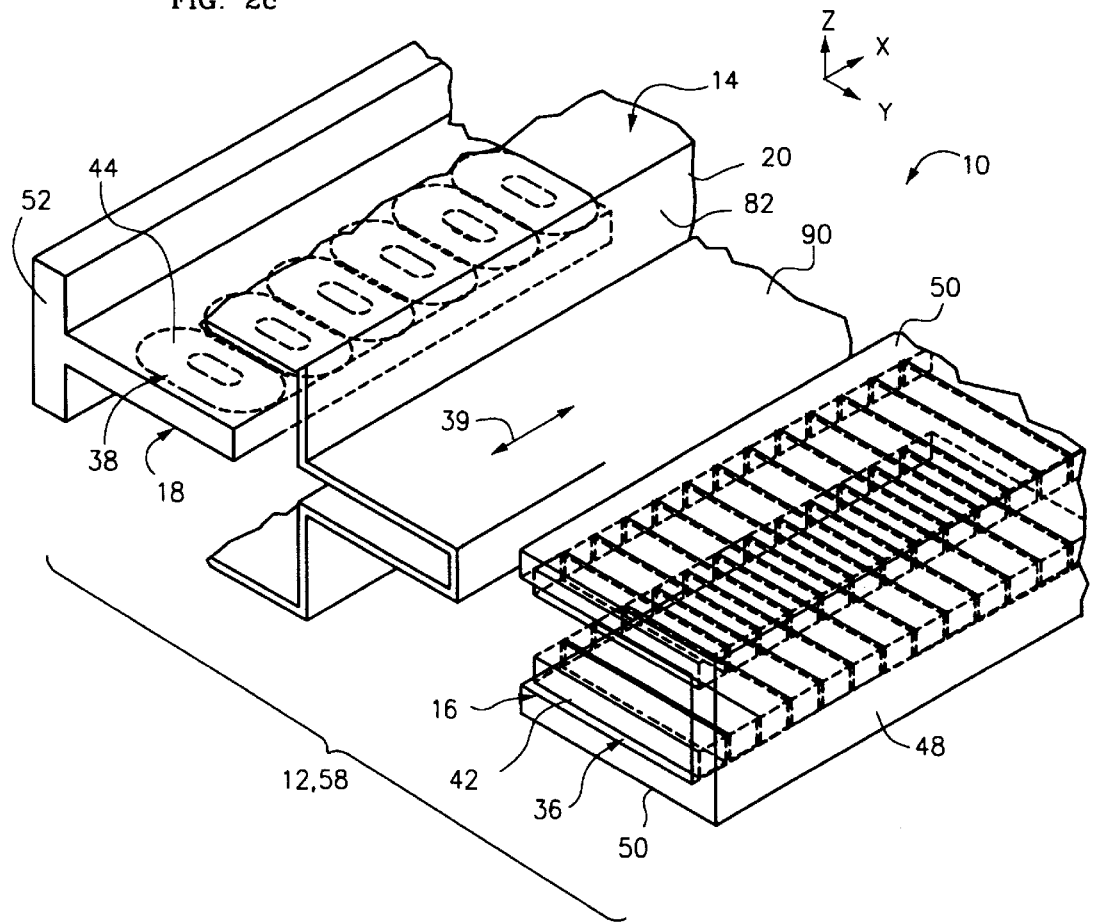
FIG. 2C is an exploded perspective view of a second embodiment of a motor and a portion of a chamber having features of the present invention.
Figure 2D:
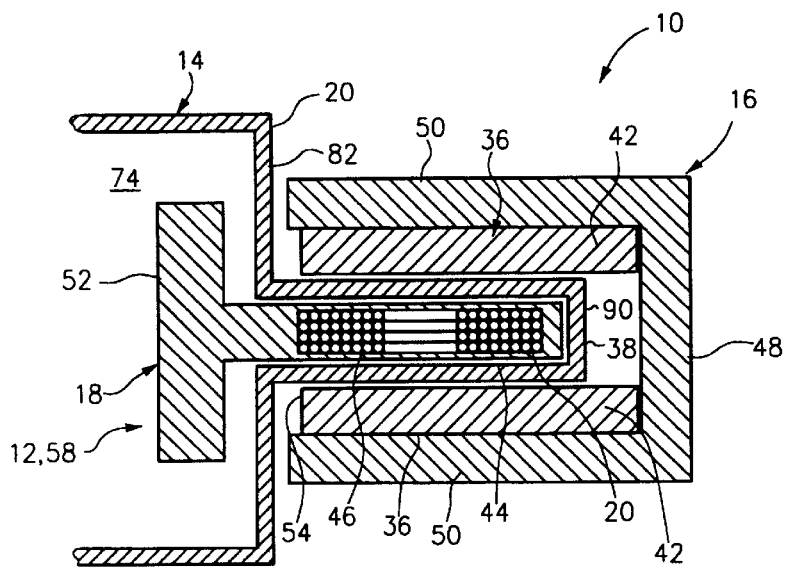
FIG. 2D is a cut-away view of the motor and a portion of the chamber of FIG. 2C.

FIG. 2C illustrates an exploded perspective view and FIG. 2D illustrates a cross-sectional view of a second embodiment of a motor 12 and a portion of the chamber 14 having features of the present invention. In this embodiment, the first component 16 includes a pair of spaced apart, magnet arrays 36 while the second component 18 includes a conductor array 38 positioned between the magnet arrays 36. More specifically, the first component 16 includes the first component body 48 having a generally "U" shaped cross-section and the pair of spaced apart legs 50. One of the magnet arrays 36 is secured to each of the legs 50. The second component 18 includes the second component body 52 having a generally "T" shaped cross-section and the conductor array 38 positioned in the second component body 52.

Similar to the embodiment discussed above, the wall 20 of the chamber 14 is positioned in the gap 54. With this design, the second component 18 is secured to the object 22 (not shown in FIGS. 2C, 2D) within the chamber 14 and the first component 16 is positioned outside the chamber 14.

In the embodiment illustrated in FIGS. 2C, 2D, the motor 12 is a commutated linear motor 58. In this embodiment, each magnet array 36 includes a plurality of rectangular shaped, spaced apart, magnets 42, and the conductor array 38 includes a plurality of spaced apart conductors 44. In this version, the second component 18 moves linearly along the X axis relative to the first component 16.

Figure 3A:
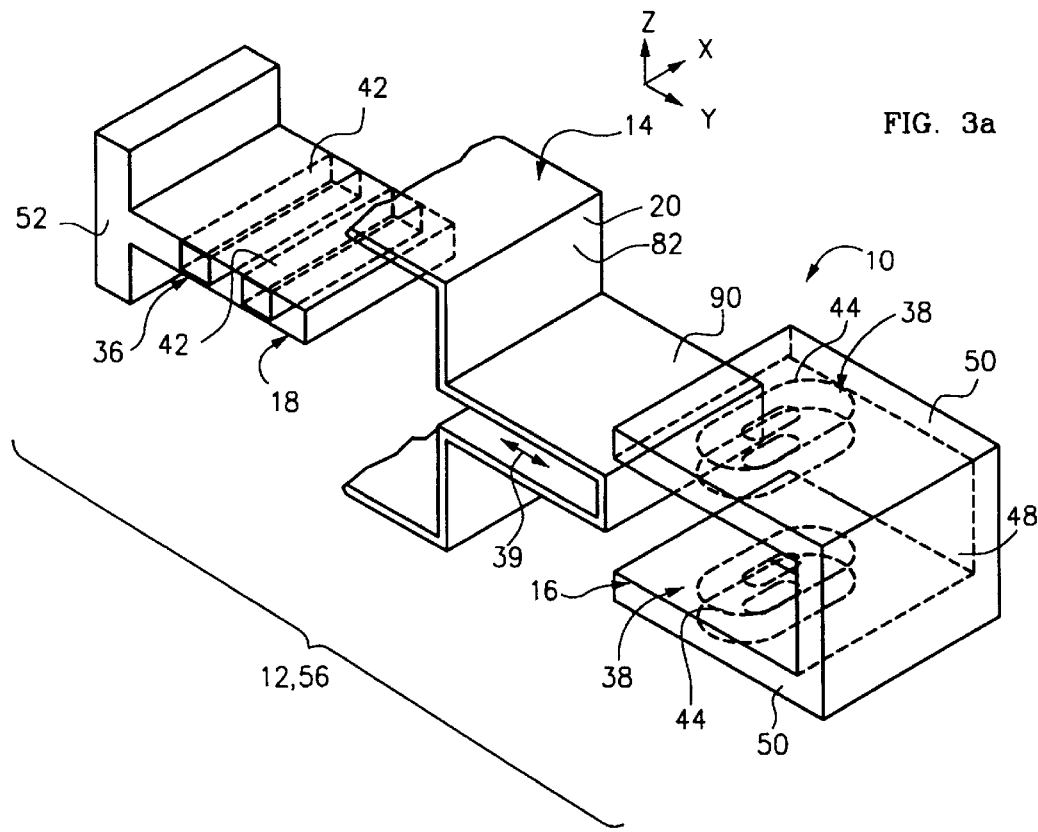
FIG. 3A is an exploded perspective view of a third embodiment of a motor and a portion of a chamber having features of the present invention.
Figure 3B:
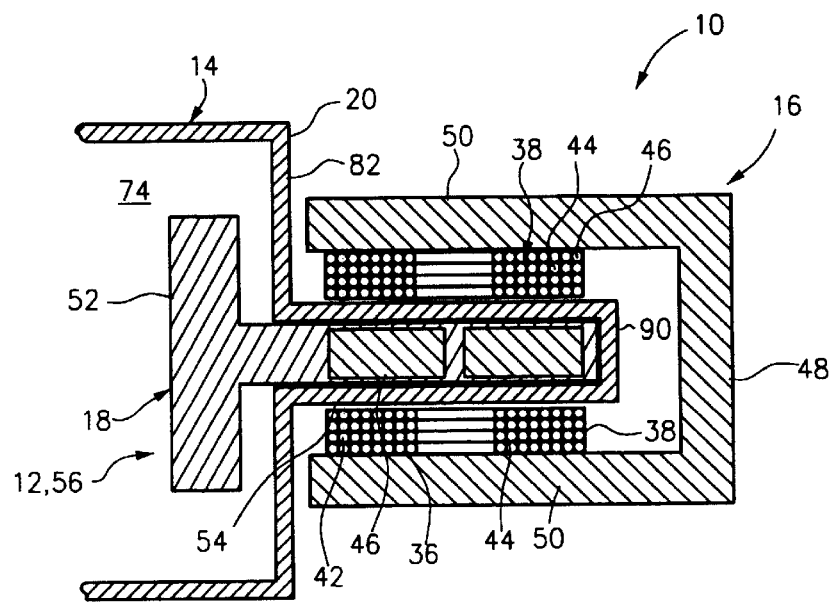
FIG. 3B is a cut-away view of the motor and a portion of the chamber of FIG. 3A.

FIG. 3A illustrates an exploded perspective view and FIG. 3B illustrates a cross-sectional view of a third embodiment of a motor 12 and a portion of the chamber 14 having features of the present invention. In this embodiment, the first component 16 includes a pair of spaced apart, conductor arrays 38 while the second component 18 includes a magnet array 36 positioned between the conductor arrays 38.

In this embodiment, the first component body 48 is again generally "U" shaped and includes the spaced apart legs 50. One of the conductor arrays 38 is secured to each of the legs 50. The second component body 52 is again generally "T" shaped. The magnet array 36 is positioned in the second component body 52. With this design, the wall 20 of the chamber 14 is positioned in the gap 54 between the first component 16 and the second component 18. Further, with this design, the second component 18 is secured to the object 22 (not shown in FIGS. 3A, 3B) within the chamber 14 and the first component 16 is positioned outside the chamber 14.

In this embodiment, the motor 12 is a non-commutated voice coil motor 56 and the second component 18 moves linearly along the Y axis relative to the first component 16. In this embodiment, each conductor array 38 includes a single conductor 44 while the magnet array 36 includes a plurality of spaced apart magnets 42.

Figure 3C:
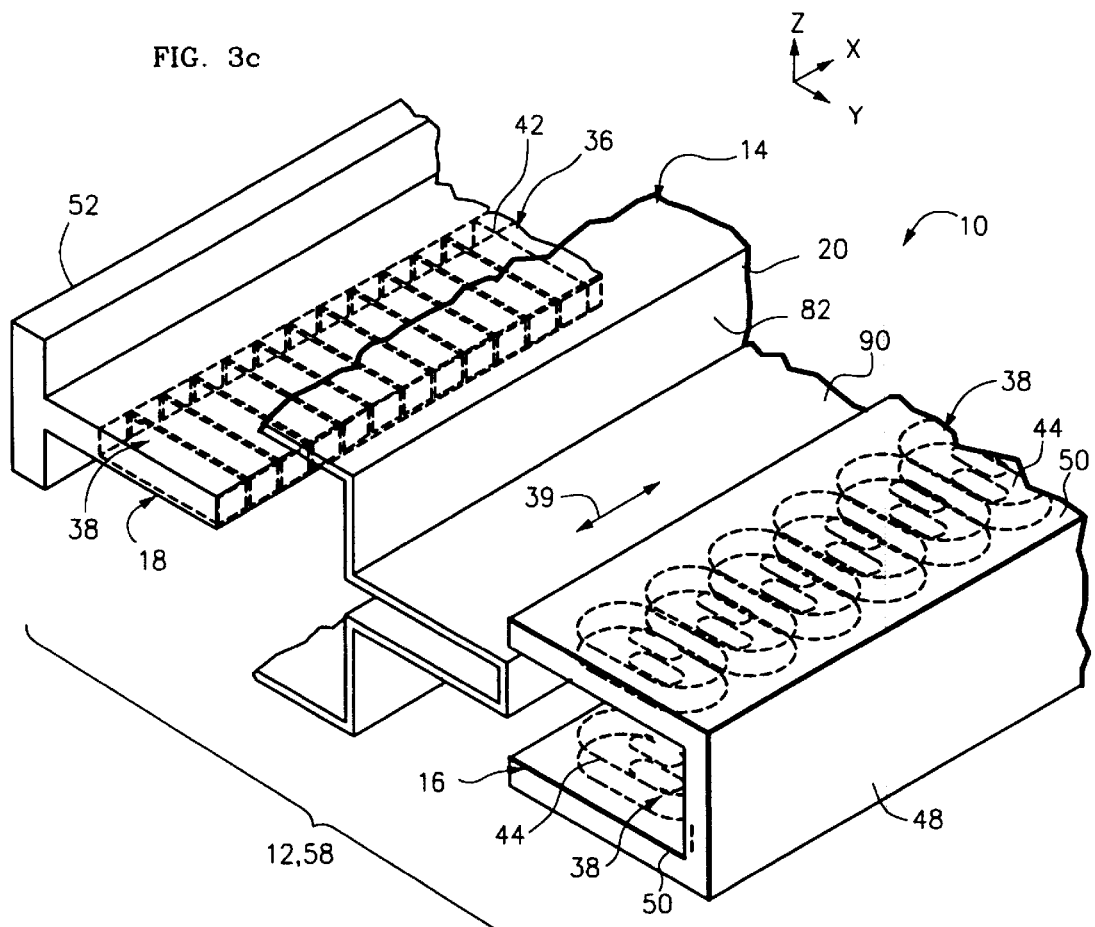
FIG. 3C is an exploded perspective view of a fourth embodiment of a motor and a portion of a chamber having features of the present invention.
Figure 3D:
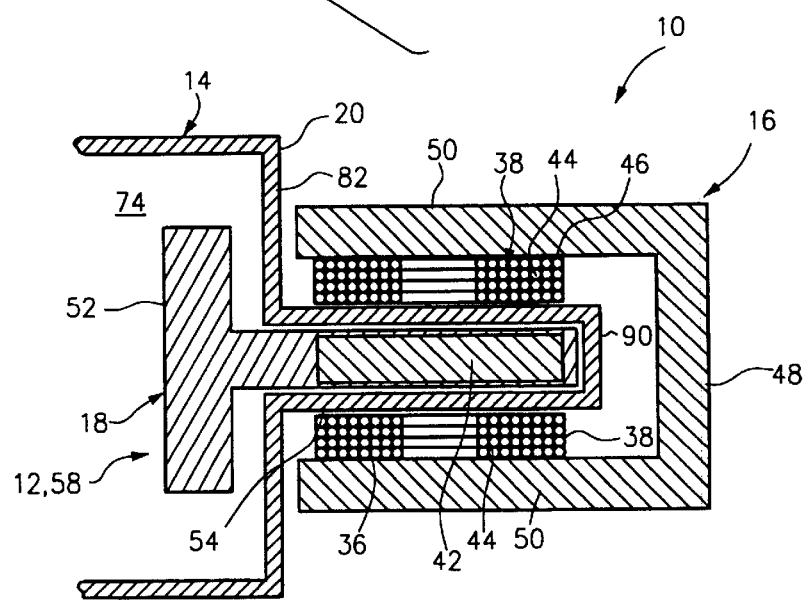
FIG. 3D is a cut-away view of the motor and a portion of the chamber of FIG. 3C.

FIG. 3C illustrates an exploded perspective view and FIG. 3D illustrates a cross-sectional view of a fourth embodiment of a motor 12 and a portion of the chamber 14 having features of the present invention. In this embodiment, the first component 16 includes a pair of spaced apart, conductor arrays 38 while the second component 18 includes a magnet array 36 positioned between the conductor arrays 38.

In this embodiment, the first component body 48 is again generally "U" shaped and includes the spaced apart legs 50. One of the conductor arrays 38 is secured to each of the legs 50. The second component body 52 is again generally "T" shaped. The magnet array 36 is positioned in the second component body 52. With this design, the wall 20 of the chamber 14 is positioned in the gap 54 between the first component 16 and the second component 18. Further, with this design, the second component 18 is secured to the object 22 (not shown in FIGS. 3C, 3D) within the chamber 14 and the first component 16 is positioned outside the chamber 14.

In this embodiment, the motor 12 is a commutated linear motor 58, the magnet array 36 includes a plurality of rectangular shaped, spaced apart, magnets 42 and each conductor array 38 includes a plurality of spaced apart conductors 44. Further, in this version, the second component 18 moves linearly along the X axis relative to the first component 16.

Figure 4A:
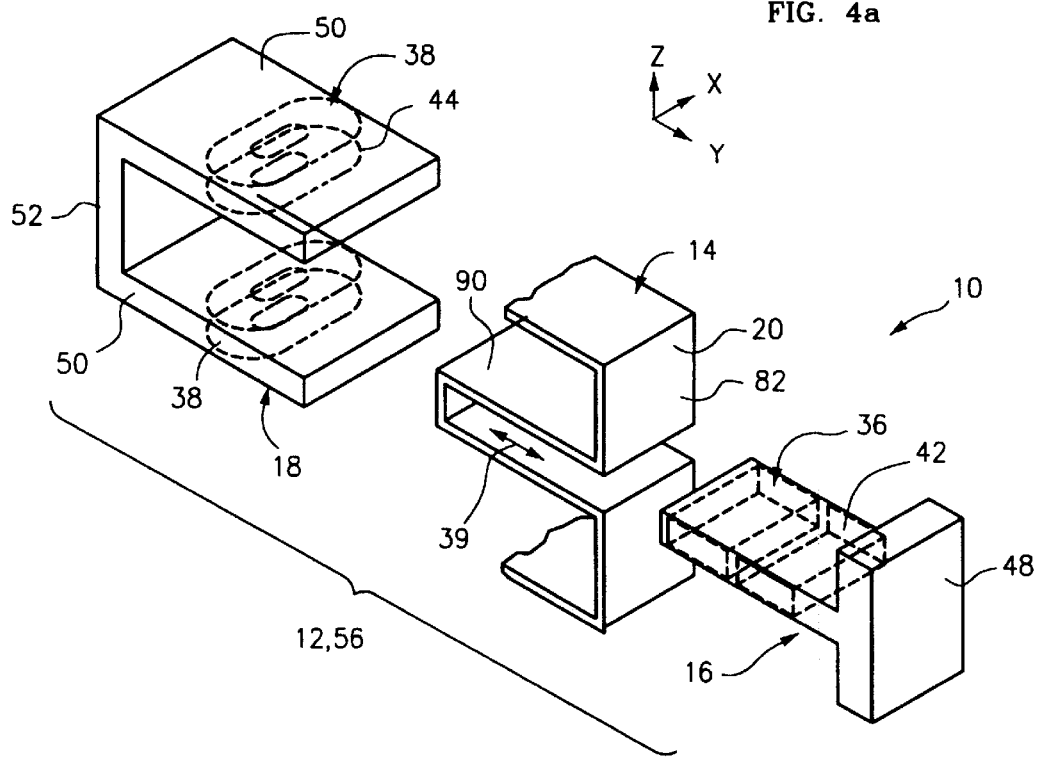
FIG. 4A is an exploded perspective view of a fifth embodiment of a motor and a portion of a chamber having features of the present invention.
Figure 4B:
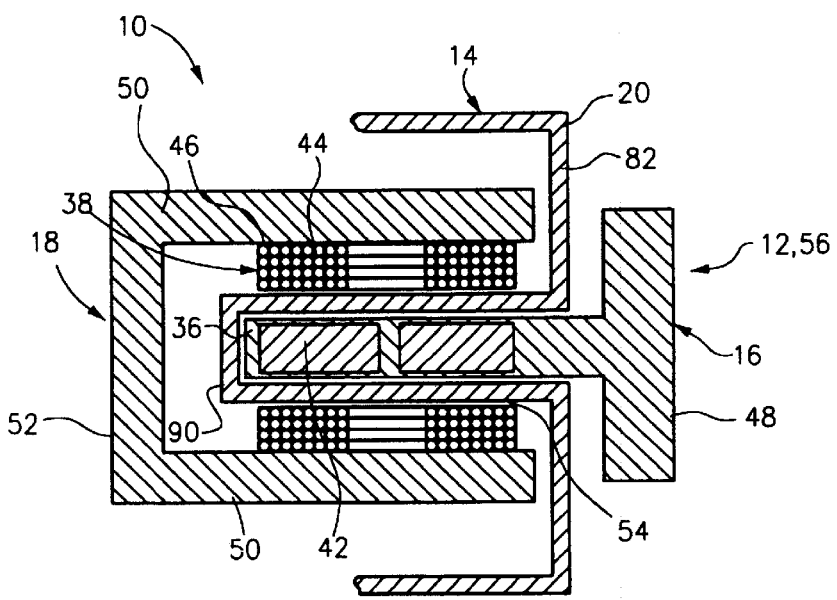
FIG. 4B is a cut-away view of the motor and a portion of the chamber of FIG. 4A.

FIG. 4A illustrates an exploded perspective view and FIG. 4B illustrates a cross-sectional view of a fifth embodiment of a motor 12 and a portion of the chamber 14 having features of the present invention. In this embodiment, the second component 18 includes a pair of spaced apart, conductor arrays 38 while the first component 16 includes a magnet array 36 positioned between the conductor arrays 38.

In this embodiment, the second component body 52 is generally "U" shaped and includes a pair of spaced apart legs 50. One of the conductor arrays 38 is secured to each of the legs 50. The first component body 48 is generally "T" shaped and the magnet array 36 is positioned in the first component body 48. With this design, the wall 20 of the chamber 14 is positioned in the gap 54 between the first component 16 and the second component 18. Further, with this design, the second component 18 is secured to the object 22 (not shown in FIGS. 4A, 4B) within the chamber 14 and the first component 16 is positioned outside the chamber 14.

In this embodiment, the motor 12 is a non-commutated voice coil motor 56 and the second component 18 moves linearly along the Y axis relative to the first component 16. Further, in this version, each conductor array 38 includes a single conductor 44 while the magnet array 36 includes a pair of magnets 42.

Figure 4C:
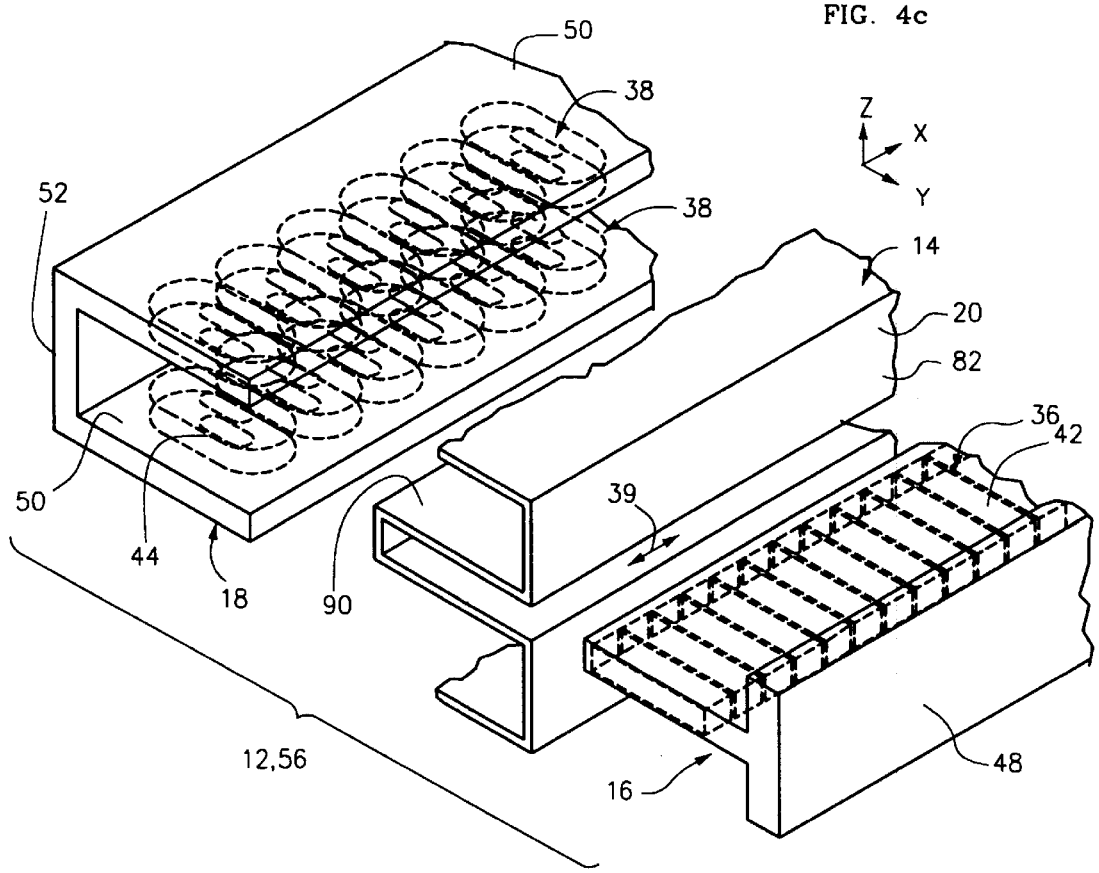
FIG. 4C is an exploded perspective view of a sixth embodiment of a motor and a portion of a chamber having features of the present invention.
Figure 4D:
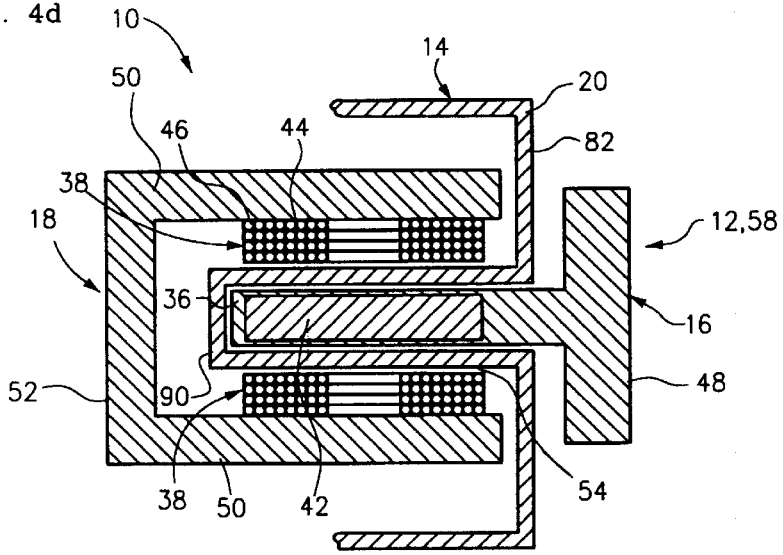
FIG. 4D is a cut-away view of the motor and a portion of the chamber of FIG. 4C.

FIG. 4C illustrates an exploded perspective view and FIG. 4D illustrates a cross-sectional view of a sixth embodiment of a motor 12 and a portion of the chamber 14 having features of the present invention. In this embodiment, the second component 18 includes a pair of spaced apart, conductor arrays 38 while the first component 16 includes a magnet array 36 positioned between the conductor arrays 38.

In this embodiment, the second component body 52 is generally "U" shaped and includes a pair of spaced apart legs 50. One of the conductor arrays 38 is secured to each of the legs 50. The first component body 48 is generally "T" shaped and the magnet array 36 is positioned in the first component body 48. With this design, the wall 20 of the chamber 14 is positioned in the gap 54 between the first component 16 and the second component 18. Further, with this design, the second component 18 is secured to the object 22 (not shown in FIGS. 4C, 4D) within the chamber 14 and the first component 16 is positioned outside the chamber 14.

In this embodiment, the motor 12 is a commutated linear motor 58, the magnet array 36 includes a plurality of rectangular shaped, spaced apart, magnets 42 and each conductor array 38 includes a plurality of spaced apart conductors 44. Further, in this embodiment, the second component 18 moves linearly along the X axis relative to the first component 16.

Figure 5A:
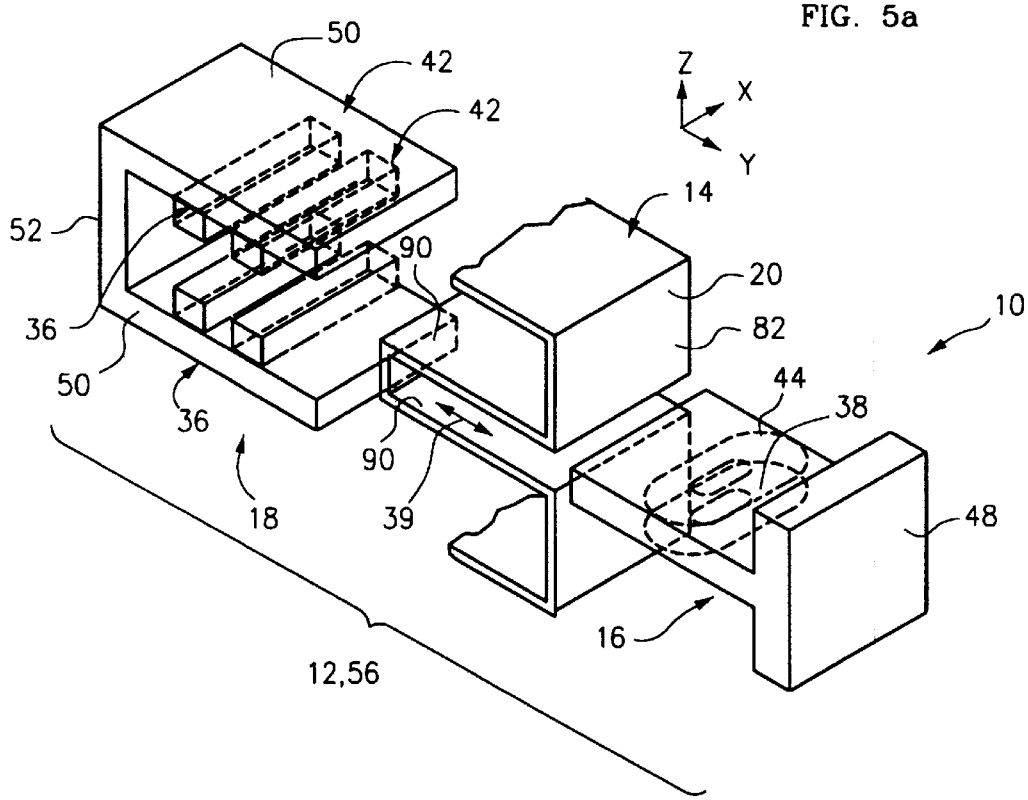
FIG. 5A is an exploded perspective view of a seventh embodiment of a motor and a portion of a chamber having features of the present invention.
Figure 5B:
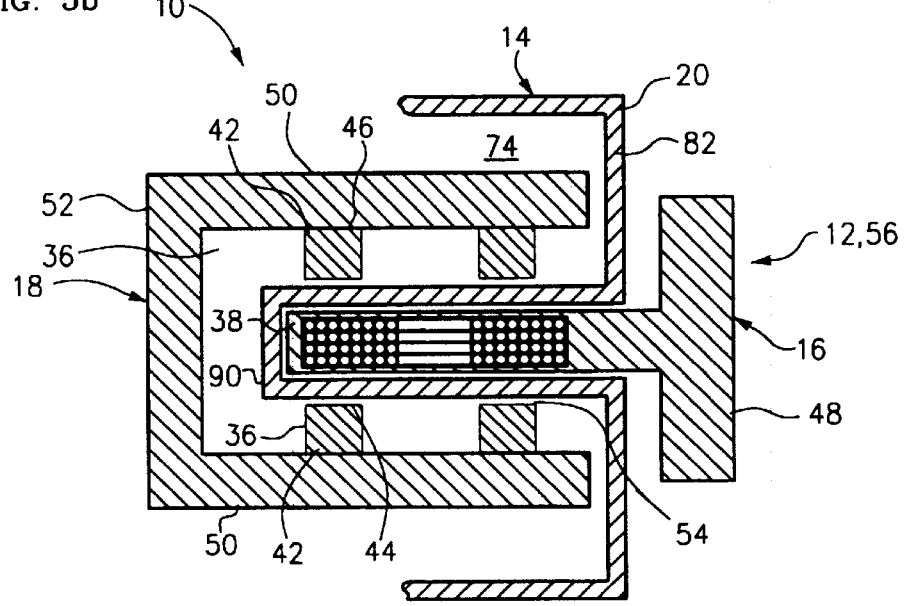
FIG. 5B is a cut-away view of the motor and a portion of the chamber of FIG. 5A.

FIG. 5A illustrates an exploded perspective view and FIG. 5B illustrates a cross-sectional view of a seventh embodiment of a motor 12 and a portion of the chamber 14 having features of the present invention. In this embodiment, the second component 18 includes a pair of spaced apart, magnet arrays 36 while the first component 16 includes a conductor array 38 positioned between the magnet arrays 36. More specifically, the second component body 52 is generally "U" shaped and includes a pair of spaced apart legs 50. One of the magnet arrays 36 is secured to each of the legs 50. The first component body 48 is generally "T" shaped and the conductor array 38 is positioned in the first component body 48. In this design, the wall 20 of the chamber 14 is positioned in the gap 54 between the first component 16 and the second component 18. With this design, the second component 18 is secured to the object 22 (not shown in FIGS. 5A, 5B) within the chamber 14 and the first component 16 is positioned outside the chamber 14.

In this embodiment, the motor 12 is a non-commutated voice coil motor 56 and the second component 18 moves linearly along the Y axis relative to the first component 16. In this embodiment, the conductor array 38 includes a single conductor 44 while each magnet array 36 includes a pair of magnets 42.

Figure 5C:
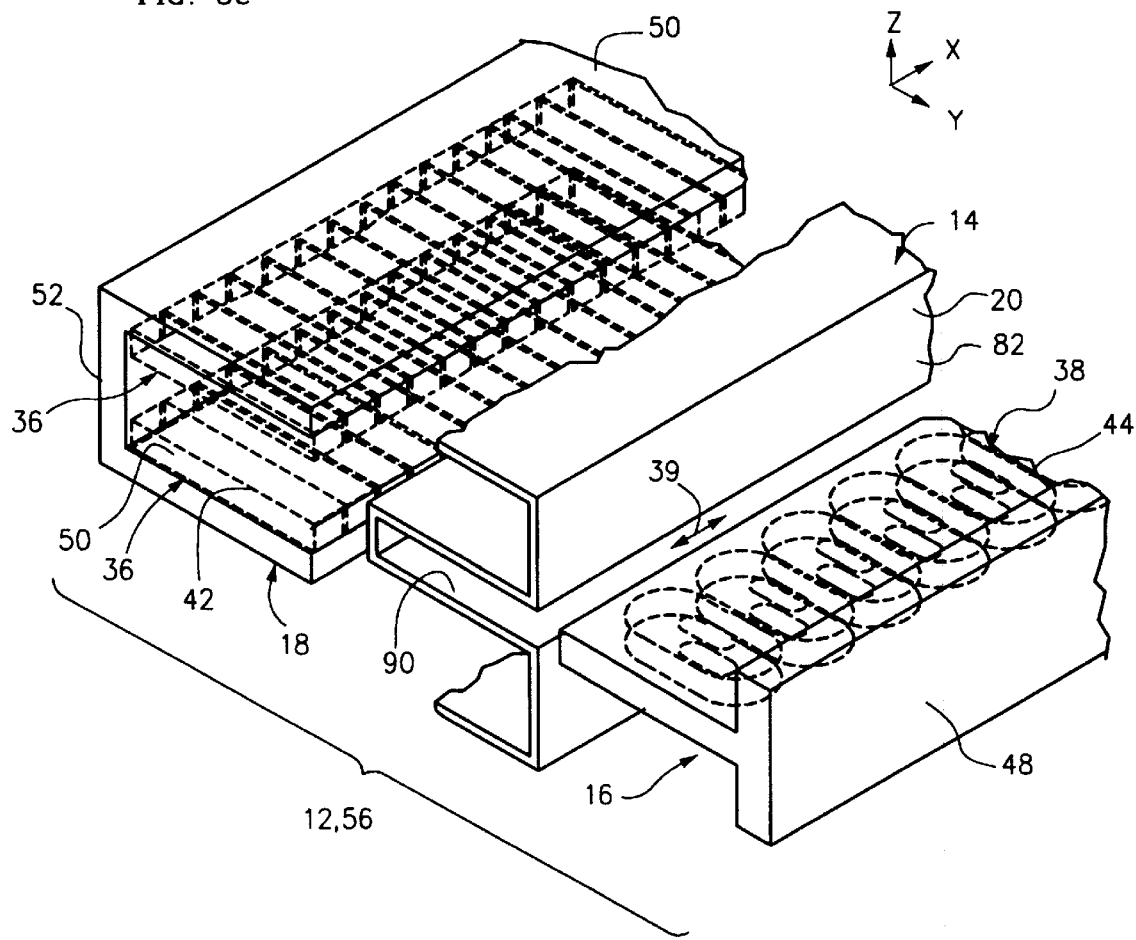
FIG. 5C is an exploded perspective view of an eighth embodiment of a motor and a portion of a chamber having features of the present invention.
Figure 5D:
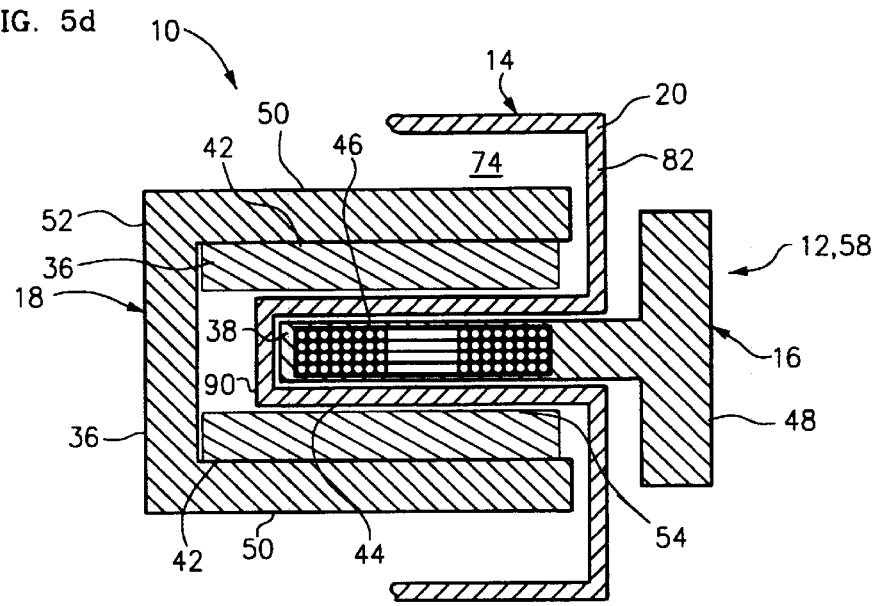
FIG. 5D is a cut-away view of the motor and a portion of the chamber of FIG. 5C.

FIG. 5C illustrates an exploded perspective view and FIG. 5D illustrates a cross-sectional view of an eighth embodiment of a motor 12 and a portion of the chamber 14 having features of the present invention. In this embodiment, the second component 18 includes a pair of spaced apart, magnet arrays 36 while the first component 16 includes a conductor array 38 positioned between the magnet arrays 36. More specifically, the second component body 52 is generally "U" shaped and includes a pair of spaced apart legs 50. One of the magnet arrays 36 is secured to each of the legs 50. The first component body 48 is generally "T" shaped and the conductor array 38 is positioned in the first component body 48. In this design, the wall 20 of the chamber 14 is positioned in the gap 54 between the first component 16 and the second component 18. With this design, the second component 18 is secured to the object 22 (not shown in FIGS. 5C, 5D) within the chamber 14 and the first component 16 is positioned outside the chamber 14.

In this embodiment, the motor 12 is a commutated linear motor 58, each magnet array 36 includes a plurality of rectangular shaped, spaced apart, magnets 42 and the conductor array 38 includes a plurality of spaced apart conductors 44. In this version, the second component 18 moves linearly along the X axis relative to the first component 16.

In the embodiments illustrated in FIGS. 2A–5D, the first component 16 is spaced apart from the wall 20 and the second component 18. Similarly, the second component 18 is spaced apart from the wall 20 and the first component 16. This allows the second component 18 to move relative to the first component 16 and the chamber 14 and the first component 16 to move relative to the second component 18 and the chamber 14.

FIGS. 6A–6D illustrate four additional embodiments of a motor 12 having features of the present invention. In these embodiments, the first component 16 is integrated into the wall 20 of the chamber 14 and fixed to the chamber 14 while the second component 18 is spaced apart and moves relative to the first component 16 and the chamber 14. In each of these embodiments, the motor 12 can be a non-commutated voice coil motor or a commutated linear motor. These designs are particularly suited for vacuum systems or high pressure applications.

Figure 6A:
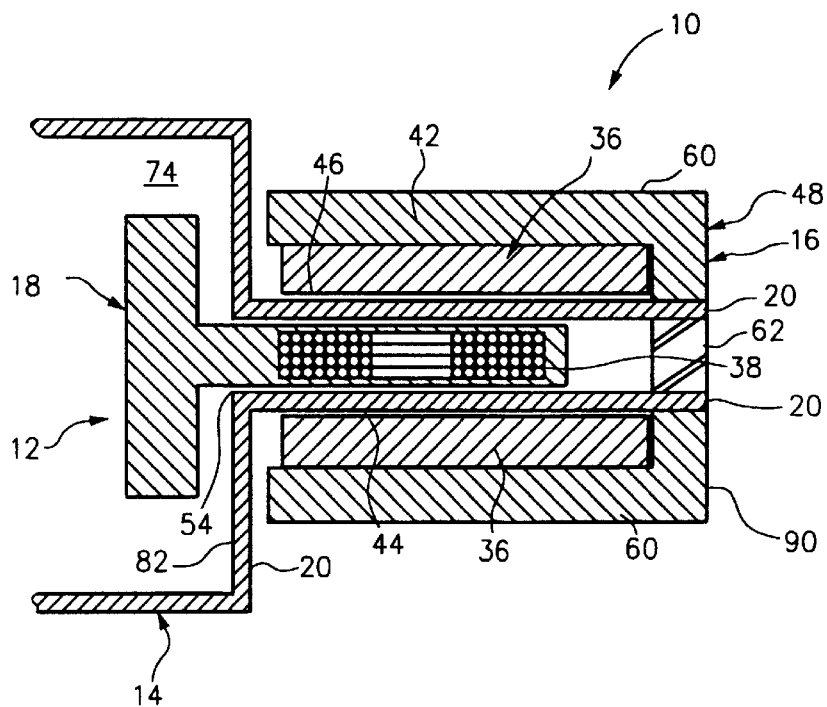
FIG. 6A is a cut-away view of a ninth embodiment of a motor and a portion of a chamber having features of the present invention.

Specifically, FIG. 6A illustrates a cross-sectional view of another embodiment of a motor 12 and a portion of the chamber 14 having features of the present invention. The embodiment illustrated in FIG. 6A is somewhat similar to the embodiment illustrated in FIG. 2D. In the embodiment illustrated in 6A, the first component 16 includes a pair of spaced apart, magnet arrays 36 while the second component 18 includes a conductor array 38 positioned between the magnet arrays 36.

The embodiment in FIG. 6A differs from the embodiment illustrated in FIG. 2D in that the first component body 48 includes a pair of spaced apart side sections 60 and a spacer section 62 which are secured together to form the first component body 48. Each side section 60 has a generally "L" shaped cross-section and the spacer section 62 is generally rectangular shaped. A portion of the wall 20 extends between each side section 60 and the spacer section 62. Further, the gap 54 exists between the wall 20 and the second component 18. With this design, the second component 18 can be secured to the object 22 (not shown in FIG. 6A) in the chamber and the first component 16 is positioned outside the chamber 14.

Figure 6B:
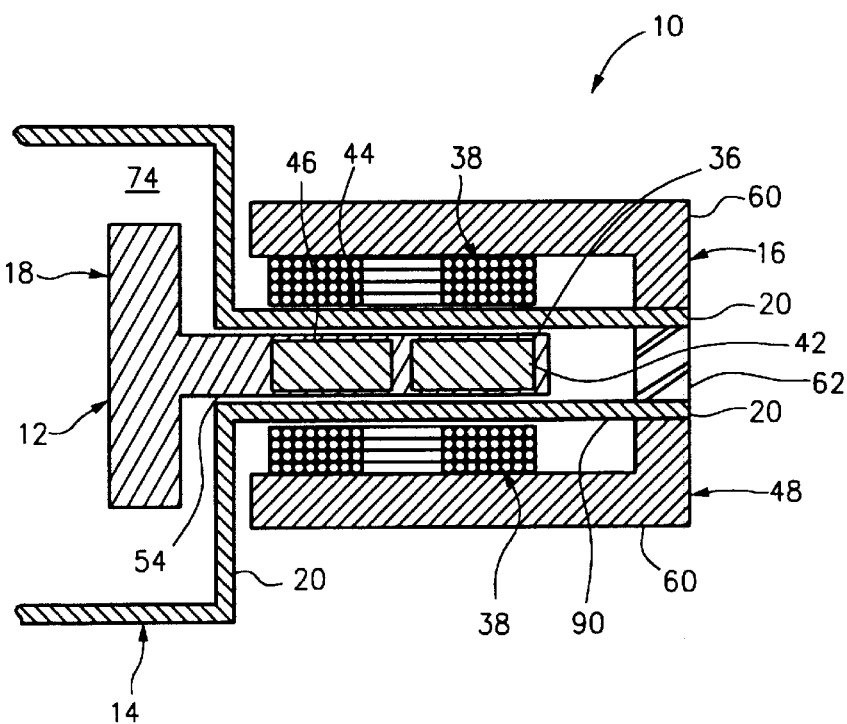
FIG. 6B is a cut-away view of a tenth embodiment of a motor and a portion of a chamber having features of the present invention.

FIG. 6B illustrates a cross-sectional view of yet another embodiment of a motor 12 and a portion of the chamber 14 having features of the present invention. The embodiment illustrated in FIG. 6B is somewhat similar to the embodiment illustrated in FIG. 3B. In the embodiment illustrated in FIG. 6B, the first component 16 includes a pair of spaced apart, conductor arrays 38 while the second component 18 includes a magnet array 36 positioned between the conductor arrays 38.

The embodiment in FIG. 6B differs from that illustrated in FIG. 3B in that the first component body 48 includes the pair of spaced apart side sections 60 and the spacer section 62 which are secured together to form the generally "U" shaped first component body 48. A portion of the wall 20 extends between each "L" shaped section 60 and the spacer section 62. The gap 54 exists between the wall 20 and the second component 18, but not between the wall 20 and the first component 16.

Figure 6C:
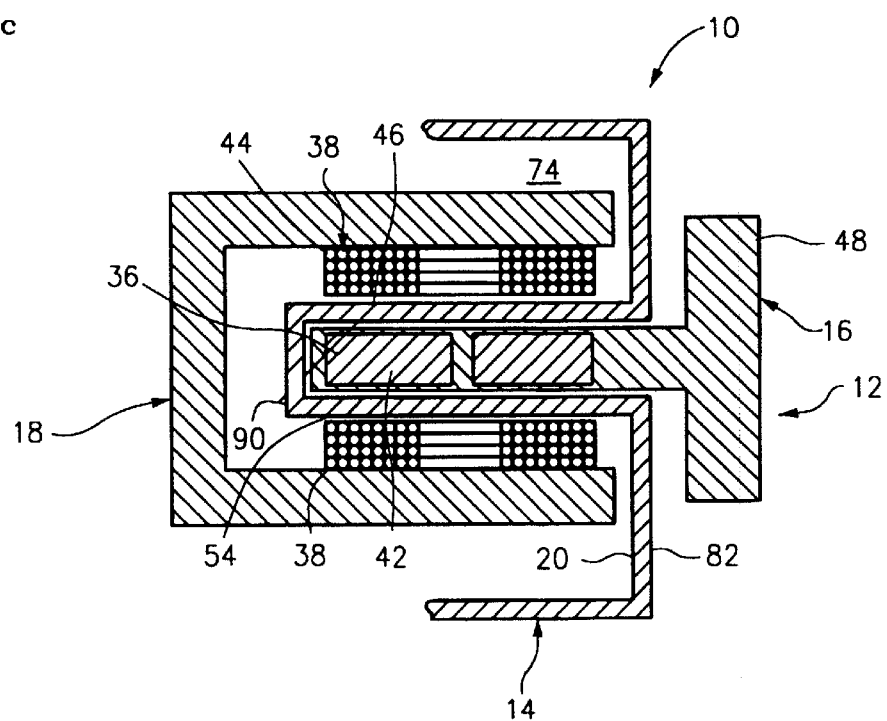
FIG. 6C is a cut-away view of an eleventh embodiment of a motor and a portion of a chamber having features of the present invention.

FIG. 6C illustrates a cross-sectional view of still another embodiment of a motor 12 and a portion of the chamber 14 having features of the present invention. The embodiment illustrated in FIG. 6C is somewhat similar to the embodiment illustrated in FIG. 4B. In the embodiment illustrated in FIG. 6C, the second component 18 includes a pair of spaced apart, conductor arrays 38 while the first component 16 includes a magnet array 36 positioned between the conductor arrays 38. The embodiment in FIG. 6C differs from FIG. 4B in that the first component 16 is secured directly to the wall 20 of the chamber 14 in FIG. 6C. The gap 54 exists between the wall 20 and the second component 18, but not between the wall 20 and the first component 16.

Figure 6D:
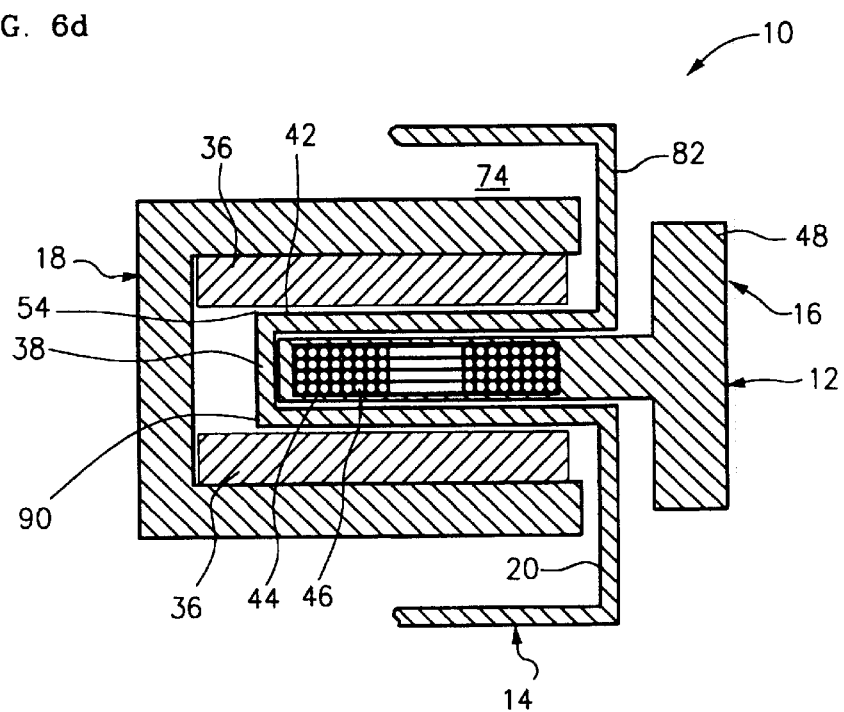
FIG. 6D is a cut-away view of a twelfth embodiment of a motor and a portion of a chamber having features of the present invention.

FIG. 6D illustrates a cross-sectional view of yet another embodiment of a motor 12 and a portion of the chamber 14 having features of the present invention. The embodiment illustrated in FIG. 6D is somewhat similar to the embodiment illustrated in FIG. 5D. In the embodiment illustrated in FIG. 6D, the second component 18 includes a pair of spaced apart, magnet arrays 36 while the first component 16 includes a conductor array 38 positioned between the magnet arrays 36. The embodiment in FIG. 6D differs from FIG. 5D in that the first component 16 is secured directly to the wall 20 of the chamber 14. The gap 54 still exists between the wall 20 and the second component 18, but not between the wall 20 and the first component 16.

Figure 7:
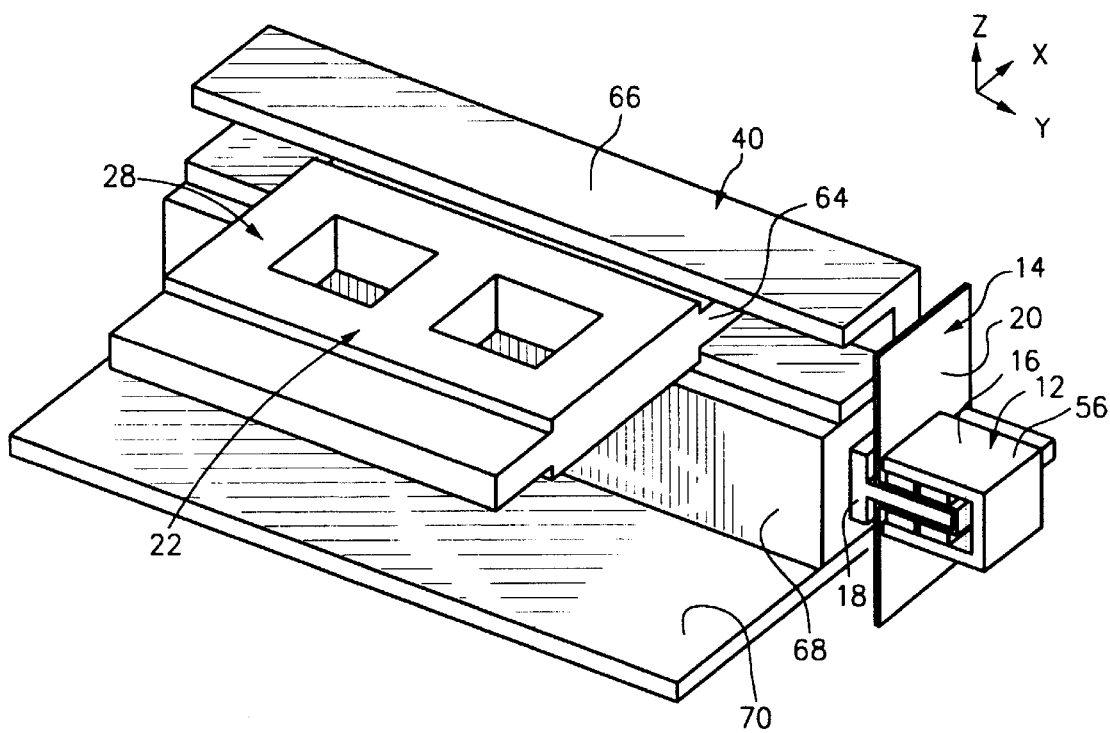
FIG. 7 is a perspective view of a portion of a motor combination and a stage having features of the present invention.

FIG. 7 illustrates an alternate reticle stage 28 design. In FIG. 7, the reticle stage 28 is moved by a pair of spaced apart, additional motors 40 (only one is illustrated for clarity) which are completely positioned within the chamber 14 to move the reticle stage 28 along the Y axis. The additional motors 40 are not magnetically coupled through the chamber 14. A coil component 64 of the additional motor 40 is integrally formed into the reticle stage 28 and a magnet component 66 is secured to the inner chamber reaction mass 68.

The inner chamber reaction mass 68 is supported above a stage base 70 by an air bearings (not shown). Through the principle of conservation of momentum, movement of the reticle stage 28 in one direction moves the inner chamber reaction mass 68 in the opposite direction. A motor 12, e.g., a voice coil motor 56 is magnetically coupled through the wall 20 of the chamber 14. The voice coil motor 56 makes minor corrections along the Y axis to the position of the inner chamber reaction mass 68.

Reaction forces from the motor 56 in FIG. 7 are transferred directly to the ground 24 (not illustrated in FIG. 7) outside the chamber 14. Only a small portion of the chamber 14 is illustrated in FIG. 7 for clarity. Importantly, in this embodiment, the chamber 14 is designed to encircle the reticle stage 28, the additional motors 40, the inner chamber reaction mass 68 and the second component 18 of the motor 56.

The chamber 14 provides a physical barrier between the first component 16 and the second component 18 of each motor 12. Further, the chamber 14 allows the second component 18 and the object 22 to be positioned in a controlled environment 21. The design of the chamber 14 can be varied to suit the design requirements of the motor 12 and the object 22. The chamber 14 is sized and shaped to substantially enclose the object 22 and the second component 18 of each motor 12 of the motor combination 10.

The chamber 14 illustrated in FIG. 1 is generally rectangular shaped and defines a generally rectangular shaped chamber cavity 74. The chamber 14 includes a pair of spaced apart, planar, end walls 76, a planar top wall 78, a planar bottom wall 80 and a pair of spaced apart, planar, side walls 82.

Figure 10:
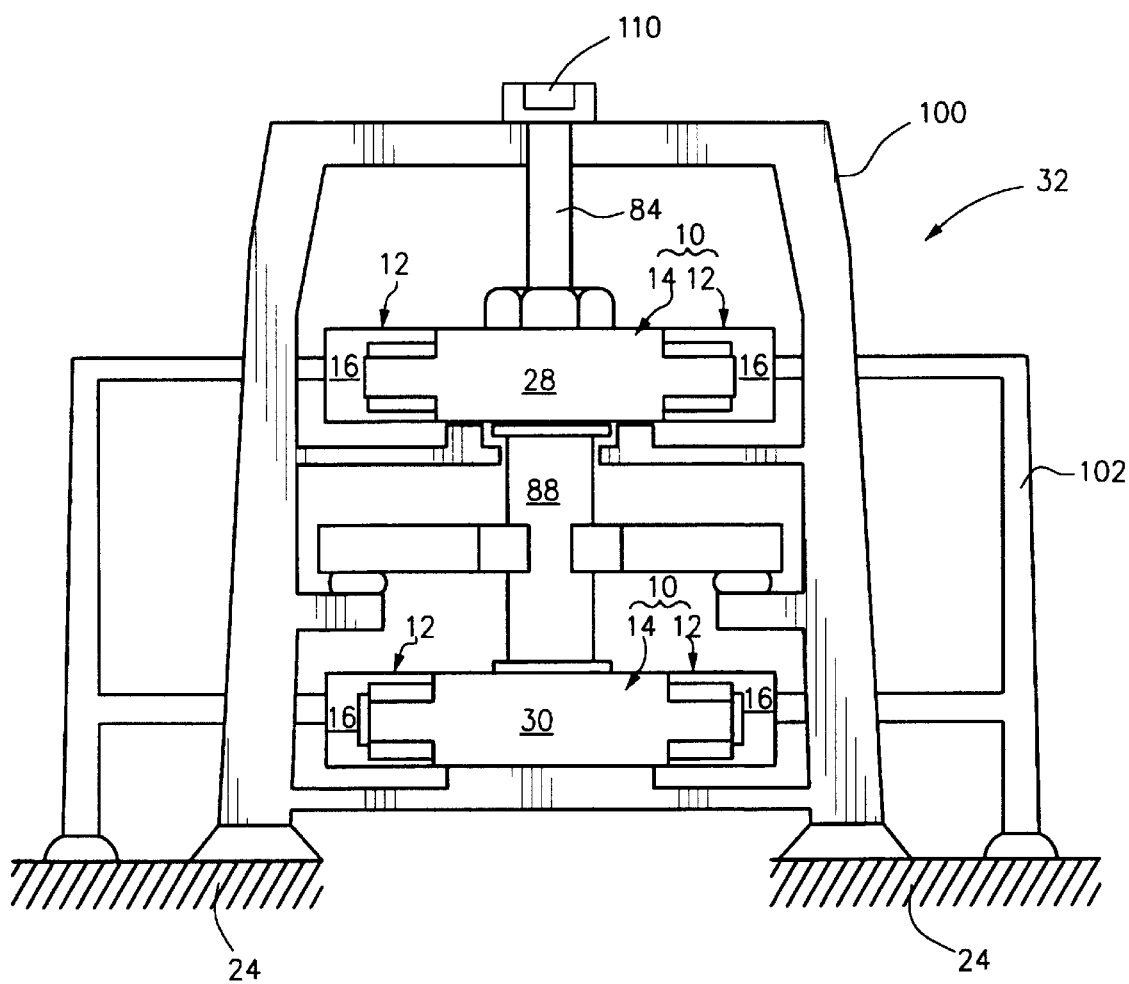
FIG. 10 is a side illustration of an exposure apparatus utilizing a motor combination having features of the present invention.

For a reticle stage 28, the top wall 78 includes an upper aperture (not shown) for an illumination system 84 (illustrated in FIG. 10) and the bottom wall 80 includes a lower aperture 86 for a lens assembly 88 (illustrated in FIG. 10). For a wafer stage 30, the top wall 78 includes an upper aperture 89 (illustrated in FIGS. 8A, 8B and 9) for the lens assembly 88. The chamber 14 also includes a generally rectangular projection 90 that extends from each side wall 82 between each of the components 16, 18 of each motor 12. Depending upon the design of each motor 12, the projection 90 can extend into the chamber cavity 74 or outwardly from the chamber cavity 74.

The walls of the chamber 14 are preferably made of a substantially non-magnetic material such as 300 series stainless steel. Because the walls 20 are non-magnetic, the walls 20 do not significantly influence the performance of the motors 12 magnetically coupled through the walls 20. The thickness of the walls 20 can be varied to suit the design requirements of the motor combination 10. Typically, the wall 20 has a thickness of between approximately one millimeter and ten millimeters.

The chamber 14 provides a controlled environment 21 around the object 22. The desired environment varies accordingly to the object 22. For example, for an exposure apparatus 32, the desired controlled environment 21 can be an inert gas 92 such as Argon, Helium, or Nitrogen. Alternately, for example, the controlled environment 21 can be a vacuum, some other fluid or some other environment. Referring to FIG. 1, a storage container 94 can be used to provide the inert gas 92 or other fluid to chamber cavity 74.

FIGS. 8A–8D illustrate a wafer stage 30 design. In this embodiment, the motor combination 10 includes a chamber 14 that encircles a wafer stage 30 and four motors 12 which are magnetically coupled through the chamber 14. A pair of spaced apart, "L" shaped frames 96 are used to secure the first components 16 of each motor 12. The frames 96 can be secured to the ground 24 (illustrated in FIG. 10).

FIG. 8B illustrates that the end walls 76 of the chamber 14 can be selectively removed from the rest of the chamber 14 for the installation and servicing of the wafer stage 30. FIG. 8C illustrates a front view of the motor combination 10. FIG. 8D is a perspective view the wafer stage 30 and the motors 12 without the chamber 14. The frames 96 and the first components 16 of each motor 12 are positioned outside the chamber 14 while the wafer stage 30 and the second component 18 of each motor 12 is positioned within the chamber 14. The walls 20 of the chamber 14 follow the contours of the stage 30 and the motors 12 with the side walls 82 positioned between the first component 16 and the second component 18 of each motor 12.

The wafer stage 30 includes a pair of spaced apart, large displacement linear motors 58 which are coupled through the chamber 14. The first component 16 of each of these motors 58 is secured to one of the frames 96. These linear motors 58 move or drive the wafer stage 30 along the X axis and around the Z axis. One voice coil motor 56 is positioned above and one voice coil motor 56 is positioned below the linear motor 58 on the right in FIG. 8D. These voice coil motors 56 are also coupled through the chamber 14 (not shown in FIG. 8D) and control the position of the stage 30 in the Y direction and connect the Y reaction forces to the ground through frame 96. An additional motor 40 is positioned completely within the chamber 14 and is used to move the wafer stage 30 along the Y axis.

FIG. 9 is a variation of the embodiment illustrated in FIGS. 8A–8D. In the embodiment illustrated in FIG. 9, each frame 96 is secured to a reaction mass 26. The reaction mass 26 is supported above a mass base 98 with air bearings (not shown) or some other guide means. The mass base 98 is secured to the ground 24 (illustrated in FIG. 10). With this design, movement of the second component 18 (not shown in FIG. 9) in one direction moves the first component 16, the frame 96 and reaction mass 26 in the opposite direction. A trim motor 99 can be connected between the reaction mass 26 and the mass base 98 to make minor corrections to the position of the reaction mass 26 and frame 96. The reaction mass 26 reduces the reaction forces transferred from the frame 96 to the ground 24. The desired weight of the reaction mass 26 can be varied. A suitable reaction mass 26 typically has a mass of between approximately one to ten times the mass of the object 22 being moved.

FIG. 10 is a schematic view illustrating an exposure apparatus 32 useful with the present invention. The exposure apparatus 32 includes an apparatus frame 100, the light source 110, the illumination system 84 (irradiation apparatus), the reticle stage 28, the lens assembly 88, and the wafer stage 30. A pair of motors 12 can be used to move and position each of the stages 28, 30.

The exposure apparatus 32 is particularly useful as a lithographic device that transfers a pattern (not shown) of an integrated circuit from a reticle onto the semiconductor wafer. The exposure apparatus 32 mounts to the ground 24 e.g., a base, or floor or some other supporting structure.

The apparatus frame 100 is rigid and supports the components of the exposure apparatus 32. The design of the apparatus frame 100 can be varied to suit the design requirements for the rest of the exposure apparatus 32. The apparatus frame 100 illustrated in FIG. 10 supports the reticle stage 28, the wafer stage 30, the lens assembly 88, and the illumination system 84 above the ground 24. Alternately, for example, separate, individual structures (not shown) can be used to support the stages 28, 30, the illumination system 84 and the lens assembly 88 above the ground 24. Further, the apparatus frame 100 can support each chamber 14 above the ground 24.

The light source 110 emits the beam (irradiation) of light energy. The illumination system 84 guides the beam of light energy from the light source 110 to the lens assembly 88. The beam illuminates selectively different portions of the reticle and exposes the wafer. In FIG. 10, the light source 110 and the illumination system 84 are illustrated as being supported above the reticle stage 28. Typically, however, the light source 110 and the illumination system 84 are secured to one of the sides of the apparatus frame 100 and the energy beam from the light source 110 is directed to above the reticle stage 28.

The lens assembly 88 projects and/or focuses the light passing through the reticle to the wafer. Depending upon the design of the apparatus 32, the lens assembly 88 can magnify or reduce the image illuminated on the reticle.

The reticle stage 28 holds and positions the reticle relative to the lens assembly 88 and the wafer. Similarly, the wafer stage 30 holds and positions the wafer with respect to the projected image of the illuminated portions of the reticle. In FIG. 10, the wafer stage 30 and the reticle stage 28 are positioned by motors 12 having features of the present invention. Depending upon the design, the apparatus 32 can also include additional motors to move the stages 28, 30. FIG. 10 illustrates that the first component 16 of each motor 12 is secured with a reaction frame 102 to the ground 24.

There are a number of different types of lithographic devices. For example, the exposure apparatus 32 can be used as scanning type photolithography system that exposes the pattern from the reticle onto the wafer with the reticle and wafer moving synchronously. In a scanning type lithographic device, the reticle is moved perpendicular to an optical axis of the lens assembly 88 by the reticle stage 28 and the wafer is moved perpendicular to an optical axis of the lens assembly 88 by the wafer stage 30. Scanning of the reticle and the wafer occurs while the reticle and the wafer are moving synchronously.

Alternately, the exposure apparatus 32 can be a step-and-repeat type photolithography system that exposes the reticle while the reticle and the wafer are stationary. In the step and repeat process, the wafer is in a constant position relative to the reticle and the lens assembly 88 during the exposure of an individual field. Subsequently, between consecutive exposure steps, the wafer is consecutively moved by the wafer stage perpendicular to the optical axis of the lens assembly 88 so that the next field of the wafer is brought into position relative to the lens assembly 88 and the reticle for exposure. Following this process, the images on the reticle are sequentially exposed onto the fields of the wafer so that the next field of the wafer is brought into position relative to the lens assembly 88 and the reticle.

However, the use of the exposure apparatus 32 provided herein is not limited to a photolithography system for semiconductor manufacturing. The exposure apparatus 32, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the motor combination 10 provided herein can be used in other devices, including other semiconductor processing equipment, elevators, electric razors, machine tools, metal cutting machines, inspection machines and disk drives.

The light source 110 can be g-line (436 nm), i-line (365 nm), KrF excimer laser (248 nm), ArF excimer laser (193 nm) and $F_2$ laser (157 nm). Alternately, the light source 110 can also use charged particle beams such as x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

In terms of the magnification of the lens assembly 88 included in the photolithography system, the lens assembly 88 need not be limited to a reduction system. It could also be a 1× or magnification system.

With respect to a lens assembly 88, when far ultra-violet rays such as the excimer laser is used, glass materials such as quartz and fluorite that transmit far ultra-violet rays is preferable to be used. When the $F_2$ type laser or x-ray is used, the lens assembly 88 should preferably be either catadioptric or refractive (a reticle should also preferably be a reflective type), and when an electron beam is used, electron optics should preferably consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage which uses no guide. As far as is permitted, the disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,118 and 5,874,820 and Japanese Patent Application Disclosure Nos. 8-166475 and 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system.

Additionally, it is desirable to manufacture an exposure system in a clean room where the temperature and cleanliness are controlled.

Figure 11:
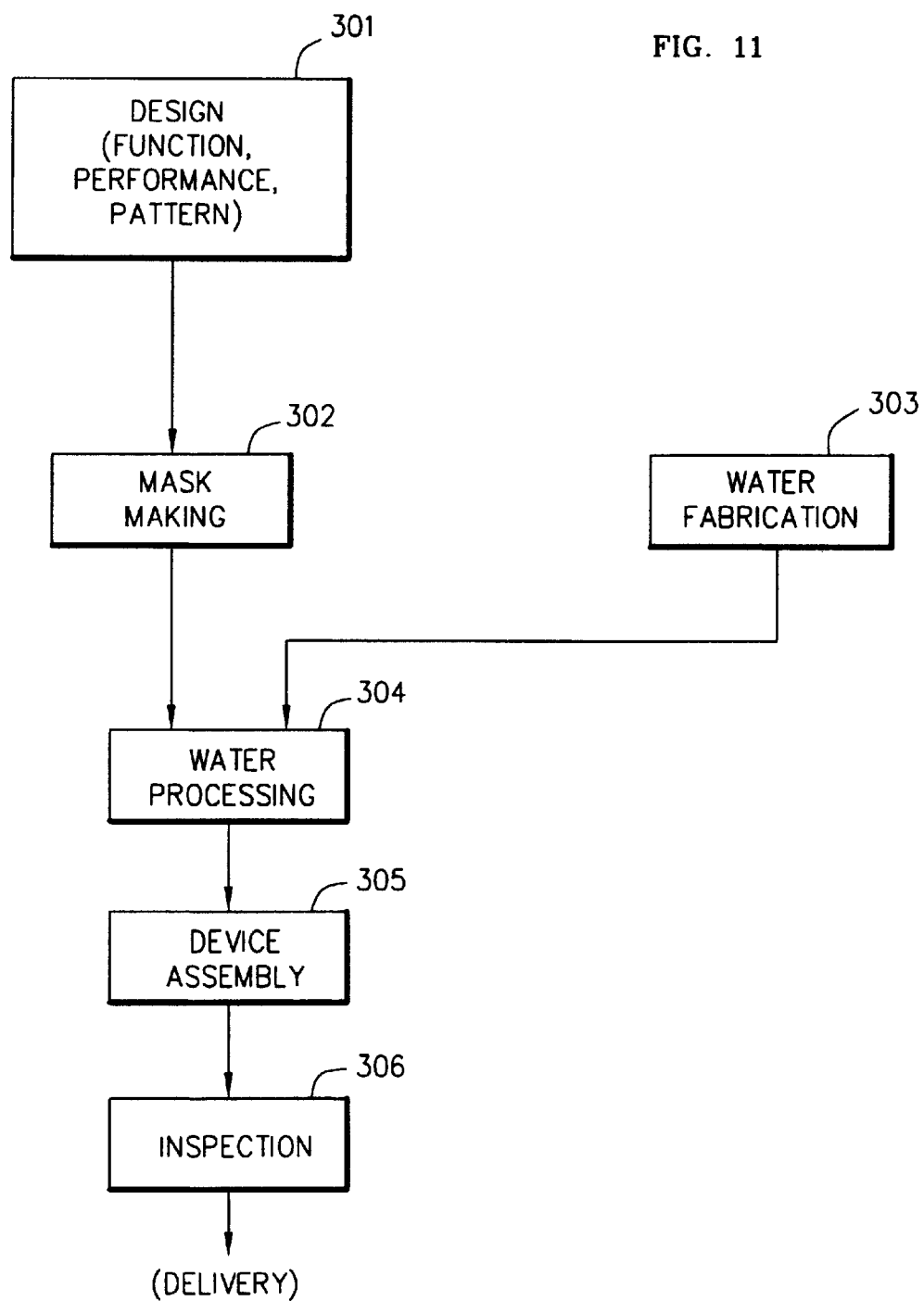
FIG. 11 is a flow chart that outlines a process for manufacturing a device in accordance with the present invention.

Further, semiconductor devices can be fabricated using the above described systems, by the process shown generally in FIG. 11. In step 301 the device's function and performance characteristics are designed. Next, in step 302, a mask (reticle) having a pattern is designed according to the previous designing step, and in a parallel step 303 a wafer is made from a silicon material. The mask pattern designed in step 302 is exposed onto the wafer from step 303 in step 304 by a photolithography system described hereinabove in accordance with the present invention. In step 305 the semiconductor device is assembled (including the dicing process, bonding process and packaging process), then finally the device is inspected in step 306.

Figure 12:
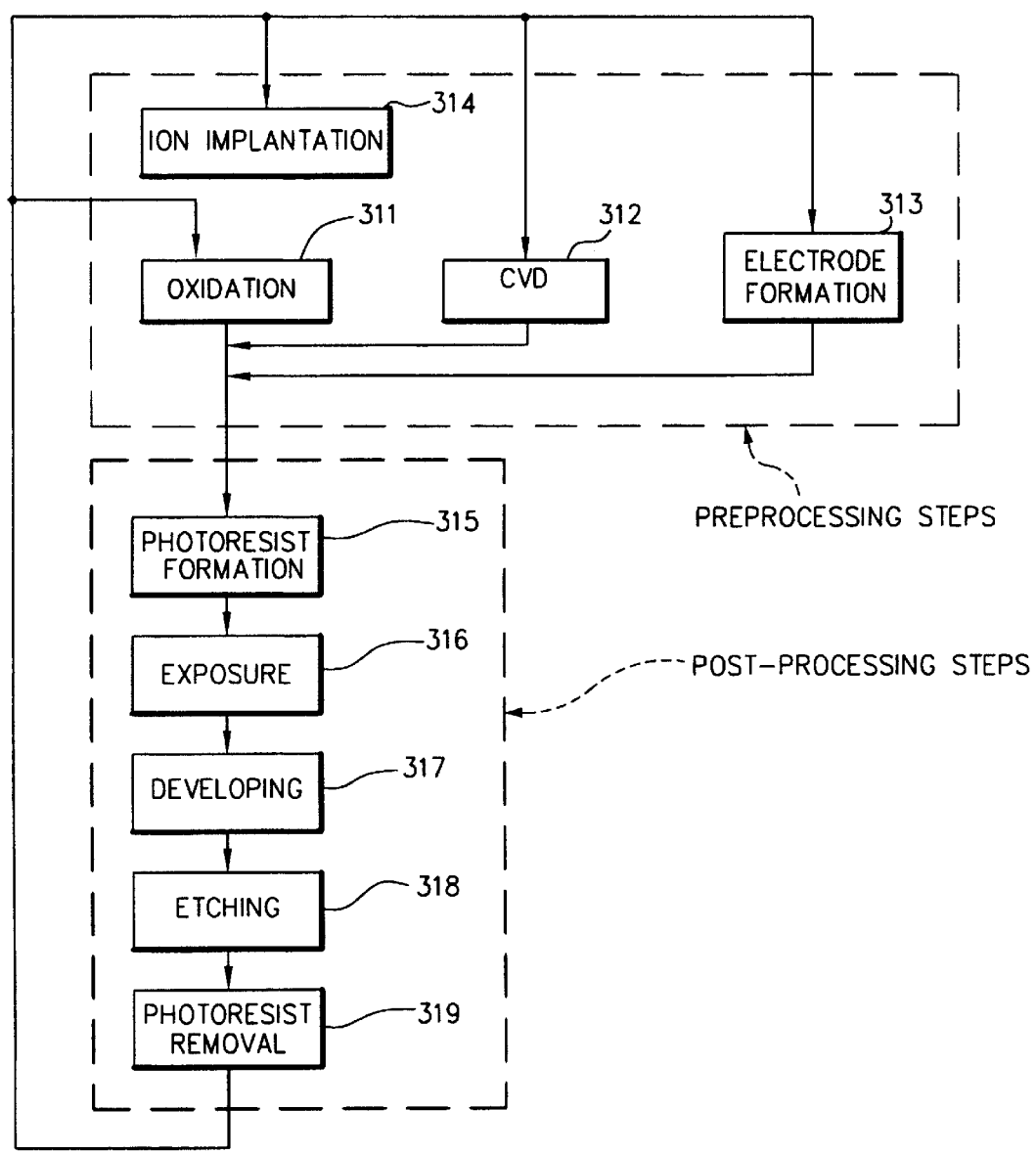
FIG. 12 is a flow chart that outlines device processing in more detail.

FIG. 12 illustrates a detailed flowchart example of the above-mentioned step 304 in the case of fabricating semiconductor devices. In FIG. 12, in step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, firstly, in step 315 (photoresist formation step), photoresist is applied to a wafer. Next, in step 316, (exposure step), the abovementioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

Importantly, the chamber 14 encloses the object 22 and allows the reaction forces of the motor 12 to be easily transferred to the ground 24 or a reaction mass 26, without compromising the seal quality of the chamber 14. As a result of the present invention, the size of the chamber 14 can be reduced because the first component 16 of the motor 12 is outside the chamber 14.

While the particular motor combination 10 as shown and disclosed herein is fully capable of obtaining the objects and providing the advantages herein before stated, it is to be understood that it is merely illustrative of the presently preferred embodiments of the invention and that many modifications are possible without materially departing from the novel teaching and advantages of this invention. For example, although illustrated as lying roughly along a straight line, the conductor array and/or the magnet array may be curved. Similarly, the conductor array and/or the magnet array may have different axes along different portions or segments or have axes in curved coordinates. The electric motor need not be a linear electric motor and the path, for example, may be curved or arc shaped. Accordingly, no limitations are intended to the details of construction or design herein shown other than as described in the appended claims.

What is claimed is:

1. A stage assembly for moving an object, the stage assembly comprising:
   a first motor including a first component and a second component and generating a force that causes relative movement between the first component and the second component, wherein one of the components includes a pair of spaced apart, magnet arrays, each magnet array including at least one magnet, and the other component includes at least one conductor that is positioned between the magnet arrays, the at least one conductor cooperating with the magnet arrays to generate the force;
   a stage member connected to the second component, the stage member retaining the object; and
   a chamber enclosing the second component and the stage member, the chamber including a first wall interposed between at least a portion of the first component and a portion of the second component of the first motor.

2. The stage assembly of claim 1 wherein the first component includes the pair of spaced apart, magnet arrays and the second component includes the at least one conductor.

3. The stage assembly of claim 1 wherein the second component includes the pair of spaced apart, magnet arrays and the first component includes the at least one conductor.

4. An exposure apparatus comprising the stage assembly of claim 1.

5. A device on which an image has been formed by the exposure apparatus of claim 4.

6. A wafer on which an image has been formed by the exposure apparatus of claim 4.

7. A stage assembly for moving an object, the stage assembly comprising:
   a first motor including a first component and a second component and generating a force that causes relative movement between the first component and the second component, wherein one of the components includes a pair of spaced apart, conductor arrays, each conductor array including at least one conductor, and the other component includes at least one magnet that is positioned between the conductor arrays, the at least one magnet cooperating with the conductor arrays to generate the force;
   a stage member connected to the second component, the stage member retaining the object; and
   a chamber enclosing the second component and the stage member, the chamber including a first wall interposed between at least a portion of the first component and a portion of the second component of the first motor.

8. The stage assembly of claim 7 wherein the first component includes the pair of spaced apart, conductor arrays and the second component includes the at least one magnet.

9. The stage assembly of claim 7 wherein the second component includes the pair of spaced apart, conductor arrays and the first component includes the at least one magnet.

10. An exposure apparatus comprising the stage assembly of claim 7.

11. A device on which an image has been formed by the exposure apparatus of claim 10.

12. A wafer on which an image has been formed by the exposure apparatus of claim 10.

13. A stage assembly for moving an object, the stage assembly comprising:

a first motor including a first component and a second component and generating a force that causes relative movement between the first component and the second component, one of the components includes at least one magnet and the other component includes at least one conductor that cooperates with at least one magnet to generate the force by utilizing a Lorentz Force in the direction along the moving of the object;

a stage member connected to the second component, the stage member retaining the object; and a chamber enclosing the second component and the stage member, the chamber including a first wall interposed between at least a portion of the first component and a portion of the second component of the first motor.

14. The stage assembly of claim 13 wherein the first component includes a pair of spaced apart, magnet arrays and the second component includes a conductor positioned between the magnet arrays.

15. The stage assembly of claim 13 wherein the first component includes a pair of spaced apart, conductor arrays and the second component includes a magnet positioned between the conductor arrays.

16. The stage assembly of claim 13 wherein the second component includes a pair of spaced apart, magnet arrays and the first component includes a conductor positioned between the magnet arrays.

17. The stage assembly of claim 13 wherein the second component includes a pair of spaced apart, conductor arrays and the first component includes a magnet positioned between the conductor arrays.

18. The stage assembly of claim 13, wherein the first wall is made of a substantially non-magnetic material.

19. The stage assembly of claim 13, wherein the chamber is subjected to a vacuum.

20. The stage assembly of claim 13, wherein the chamber contains an inert gas.

21. The stage assembly of claim 13, wherein the one of the components is integral with the chamber wall.

22. The stage assembly of claim 13, further comprising of a reaction mass coupled to the second component of the first motor within the chamber.

23. The stage assembly of claim 13, further comprising of a reaction mass coupled to the first component of the first motor outside the chamber.

24. The stage assembly of claim 13, further comprising a second motor spaced apart from the first motor; wherein the chamber encircles at least a portion of the second motor.

25. The stage assembly of claim 24, wherein the second motor comprises a first component and a second component connected to the stage member and generates a force that causes relative movement between the first component and the second component, one of the components includes at least one magnet and other component includes at least one conductor that cooperates with at least one magnet to generate the force by utilizing a Lorentz Force; and the chamber includes a second wall interposed between at least a portion of the first component and a portion of the second component of the second motor.

26. An exposure apparatus comprising the stage assembly of claim 13.

27. A device on which an image has been formed by the exposure apparatus of claim 26.

28. A wafer on which an image has been formed by the exposure apparatus of claim 26.

29. A motor combination for moving an object, the motor combination comprising:

a first motor including a first component and a second component and generating a first force that causes relative movement between the first component and the second component, one of the components includes at least one magnet and the other component includes at least one conductor that cooperates with at least one magnet to generate the first force by utilizing a Lorentz Force in the direction along the moving of the object;

a second motor including a first component and a second component and generating a second force that causes relative movement between the first component and the second component, one of the components includes at least one magnet and the other component includes at least one conductor that cooperates with at least one magnet to generate the second force by utilizing a Lorentz Force in a direction along the moving of the object; and a chamber including a first wall interposed between at least a portion of the first component and a portion of the second component of the first motor and a second wall interposed between at least a portion of the first component and a portion of the second component of the second motor.

30. The motor combination of claim 29 wherein, for at least one of the motors, the first component includes a pair of spaced apart, magnet arrays and the second component includes a conductor array positioned between the magnet arrays.

31. The motor combination of claim 29 wherein, for at least one of the motors, the first component includes a pair of spaced apart, conductor arrays and the second component includes a magnet array positioned between the conductor arrays.

32. The motor combination of claim 29 wherein, for at least one of the motors, the second component includes a pair of spaced apart, magnet arrays and the first component includes a conductor array positioned between the magnet arrays.

33. The motor combination of claim 29 wherein, for at least one of the motors, the second component includes a pair of spaced apart, conductor arrays and the first component includes a magnet array positioned between the conductor arrays.

34. An exposure apparatus comprising a stage member for retaining an object and the motor combination of claim 29, wherein the stage member is connected to the second components of the first motor and the second motor and moves relative to the chamber, and the chamber substantially encircles the stage member.

35. A device on which an image has been formed by the exposure apparatus of claim 34.

36. A wafer on which an image has been formed by the exposure apparatus of claim 34.

37. A method for enclosing and moving an object retained by a stage member, the method comprising the steps of:

encircling the object and the stage member with a chamber, magnetically coupling a first motor through the chamber, the first motor including a first component positioned outside of the chamber and a second component positioned within the chamber, the second component being attached to the stage member, and generating relative movement between the first component and the second component, and wherein one of the components includes at least one magnet and the other component includes at least one conductor that cooperates with at least one magnet to generate a force by utilizing a Lorentz Force in the direction along the relative movement.

38. A method for making a stage assembly for moving an object, the method comprising the steps of:

providing a motor including a first component and a second component and generating a force that causes relative movement between the first component and the second component, one of the components includes at least one magnet and the other component includes at least one conductor that cooperates with at least one magnet to generate the force by utilizing a Lorentz Force;

connecting a stage member to the second component, the stage member retaining the object; and enclosing the second component and the stage member by a chamber, the chamber including a first wall interposed between at least a portion of the first component and a portion of the second component of the motor;

wherein the relative movement of the first motor includes moving the moving component substantially parallel to the first wall of the chamber.

39. The method of claim 38 wherein the step of providing a motor includes providing a first component having a pair of spaced apart, magnet arrays and providing a second component having a conductor array positioned between the magnet arrays.

40. The method of claim 38 wherein the step of providing a motor includes providing a first component having a pair of spaced apart, conductor arrays and providing a second component having a magnet array positioned between the conductor arrays.

41. The method of claim 38 wherein the step of providing a motor includes providing a second component having a pair of spaced apart, magnet arrays and providing a first component includes a conductor array positioned between the magnet arrays.

42. The method of claim 38 wherein the step of providing a motor includes providing a second component having a pair of spaced apart, conductor arrays and providing a first component includes a magnet array positioned between the conductor arrays.

43. A method for making an exposure apparatus that forms an image on a wafer, the method comprising the steps of:

providing an irradiation apparatus that irradiates the wafer with radiation to form the image on the wafer; and providing the stage assembly made by the method of claim 38.

44. A method of making a device including at least the exposure process wherein the exposure process utilizes the exposure apparatus made by the method of claim 43.

* * * * *